US011276837B2

(12) United States Patent
Makishima et al.

(10) Patent No.: US 11,276,837 B2
(45) Date of Patent: Mar. 15, 2022

(54) MANUFACTURING METHOD FOR ELECTRONIC DEVICE

(71) Applicant: Konica Minolta, Inc., Tokyo (JP)

(72) Inventors: Yukihiro Makishima, Hino (JP); Hideo Taka, Hachioji (JP); Hiroshi Kita, Hachioji (JP); Yoshiyuki Suzuri, Yonezawa (JP); Lina Yoshida, Yonezawa (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 16/761,739

(22) PCT Filed: Nov. 9, 2018

(86) PCT No.: PCT/JP2018/041589
§ 371 (c)(1),
(2) Date: May 5, 2020

(87) PCT Pub. No.: WO2019/093459
PCT Pub. Date: May 16, 2019

(65) Prior Publication Data
US 2020/0266381 A1 Aug. 20, 2020

(30) Foreign Application Priority Data

Nov. 10, 2017 (JP) .............................. JP2017-217354
Jun. 22, 2018 (JP) .............................. JP2018-118929

(51) Int. Cl.
*H01L 21/00* (2006.01)
*H01L 51/52* (2006.01)
(Continued)

(52) U.S. Cl.
CPC .......... *H01L 51/524* (2013.01); *H01L 29/786* (2013.01); *H01L 51/5012* (2013.01);
(Continued)

(58) Field of Classification Search
CPC ..................................................... H01L 51/524
See application file for complete search history.

(56) References Cited

U.S. PATENT DOCUMENTS

| 1,868,581 A | 7/1932 | Miller |
| 4,982,019 A | 1/1991 | Purdy et al. |

(Continued)

FOREIGN PATENT DOCUMENTS

| JP | 2003-238688 A | 8/2003 |
| JP | 2005-000792 A | 1/2005 |

(Continued)

OTHER PUBLICATIONS

Inoue Masanori, "Sealing Method for Organic Electroluminescent element", Dec. 14, 2014 (Year: 2015).*
(Continued)

*Primary Examiner* — Caleb E Henry
(74) *Attorney, Agent, or Firm* — Lucas & Mercanti, LLP

(57) ABSTRACT

The present invention addresses the problem of providing a manufacturing method for an electronic device that is provided with an organic thin film functioning as a sealing film against moisture permeation in an electronic device such as an organic electroluminescence element. This manufacturing method for an electronic device is a manufacturing method for an electronic device that has at least an organic functional layer, an elution prevention film, and a sealing film in this order, said manufacturing method being characterized by having: a step in which, after coating is performed with a silicone resin, the result is irradiated with vacuum ultraviolet rays to form the elution prevention film; and a step in which, after the elution prevention film is coated with a liquid mixture of a metal alkoxide and a fluoroalcohol, the result is irradiated with vacuum ultraviolet rays to form the ultraviolet rays to form the sealing film.

6 Claims, 6 Drawing Sheets

(51) Int. Cl.

| | | |
|---|---|---|
| *H01L 29/786* | (2006.01) | |
| *H01L 51/50* | (2006.01) | |
| *H01L 51/56* | (2006.01) | |
| *H05B 33/04* | (2006.01) | |
| *H05B 33/10* | (2006.01) | |

(52) U.S. Cl.
    CPC ............. *H01L 51/56* (2013.01); *H05B 33/04* (2013.01); *H05B 33/10* (2013.01)

(56) References Cited

U.S. PATENT DOCUMENTS

| | | | |
|---|---|---|---|
| 5,599,588 A | 2/1997 | Poncelet | |
| 6,426,319 B1 | 7/2002 | Kostansek | |
| 9,459,741 B2 * | 10/2016 | Kim | ........................ G06F 3/041 |
| 2014/0106151 A1 * | 4/2014 | Mori | ..................... B32B 27/302 428/216 |
| 2015/0064401 A1 * | 3/2015 | Honda | .................... B32B 27/00 428/141 |
| 2015/0125679 A1 * | 5/2015 | Ishikawa | ............. H01L 51/5253 428/216 |
| 2016/0020426 A1 | 1/2016 | Aoyama et al. | |
| 2016/0186009 A1 * | 6/2016 | Goto | ........................ C08J 7/123 257/40 |
| 2020/0335727 A1 * | 10/2020 | Makishima | ............ B01D 53/28 |

FOREIGN PATENT DOCUMENTS

| | | |
|---|---|---|
| JP | 2011-023283 A | 2/2011 |
| JP | 2015-221757 A | 12/2015 |
| JP | 2015-225785 A | 12/2015 |

OTHER PUBLICATIONS

PCT, International Preliminary Report on Patentability for the corresponding application No. PCT/JP2018/041589, dated May 12, 2020, with English translation.
PCT, International Preliminary Report on Patentability for the related application No. PCT/JP2018/041587, dated May 12, 2020, with English translation.
PCT, International Search Report for the related application No. PCT/JP2018/041587, dated Feb. 12, 2019, with English translation.
JPO, Notice of Reasons for Refusal for the related Japanese patent application No. 2019-502263, dated Apr. 9, 2019, with English translation.
PCT, International Search Report for the corresponding application No. PCT/JP2018/041589, dated Feb. 12, 2019, with English translation (4 pages).
USPTO, Office Action for the related U.S. Appl. No. 16/761,734, dated Jun. 3, 2021.
USPTO, Office Action for the related U.S. Appl. No. 16/761,734, dated Dec. 1, 2021.

* cited by examiner

*FIG. 3*
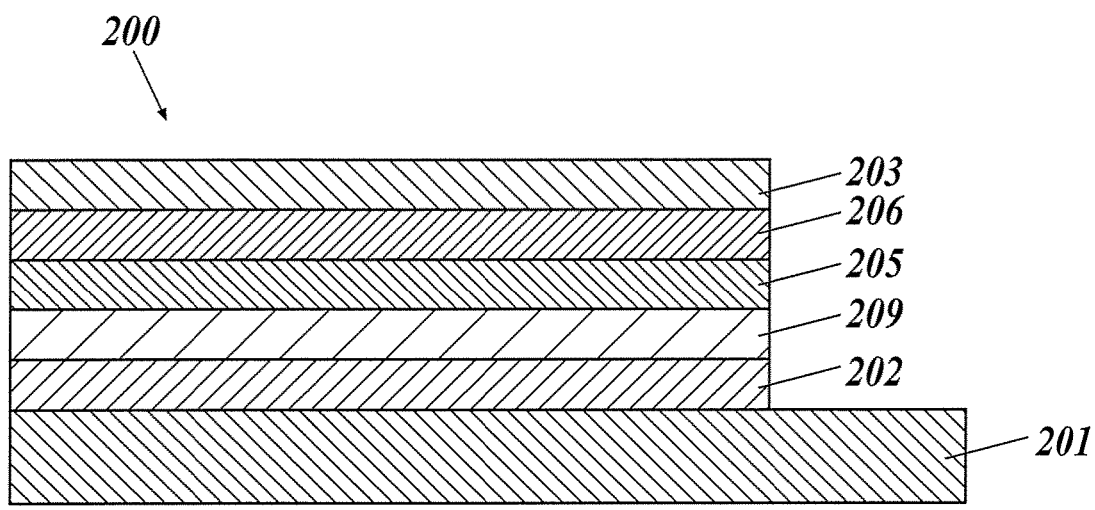
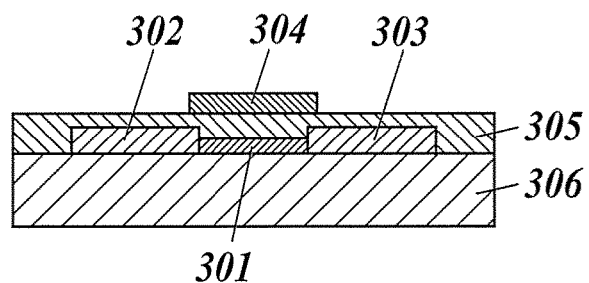
*FIG. 4A*
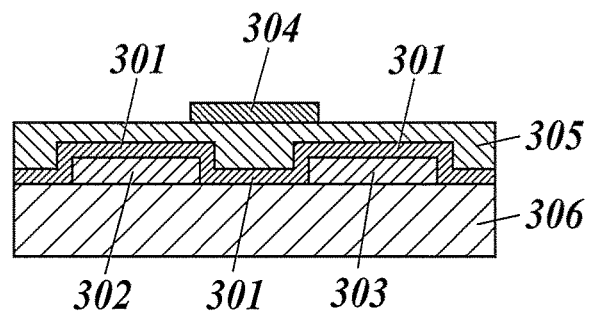
*FIG. 4B*

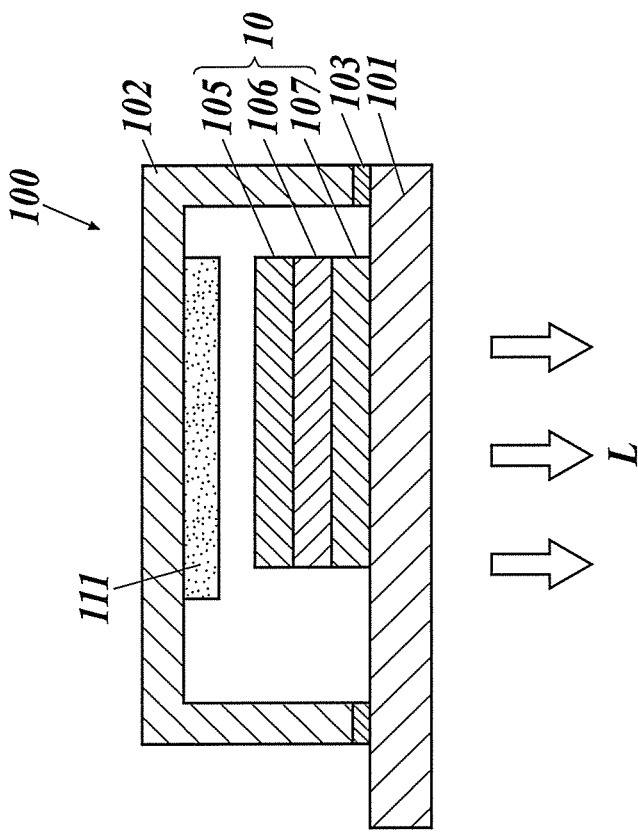

MANUFACTURING METHOD FOR ELECTRONIC DEVICE

CROSS REFERENCE TO RELATED APPLICATION

This Application is a 371 of PCT/JP2018/041589 filed on Nov. 9, 2018 which, in turn, claimed the priority of Japanese Patent Application No. 2017-217354 filed on Nov. 10, 2017 and Japanese Patent Application No. 2018-118929 filed on Jun. 22, 2018, all of which are incorporated herein by reference.

TECHNICAL FIELD

The present invention relates to a method of manufacturing an electronic device, and more particularly, the present invention relates to a method of manufacturing an electronic device comprising an organic thin film functioning as a moisture permeable sealing film for an electronic device such as an organic electroluminescent element.

BACKGROUND

In the industry, a number of electronic components, including transistors and diodes, are subjected to a process called sealing (passivation) to avoid the degradation caused by water and oxygen. In particular, organic thin film transistors, organic thin film solar cells, and organic electroluminescence elements (hereinafter referred to as organic EL elements), in which electron conduction is performed by organic compounds, are particularly sensitive to water molecules, and extremely high sealing is required. Among them, since the organic EL element is in an excited state having the highest reactivity as an organic matter during light emission, the number of water molecules rather than the water concentration must be dealt with, and a desiccant agent for capturing water molecules is required in addition to a high gas barrier. In addition, it is necessary to adhere a film or glass having a gas barrier property to a device substrate, and it is necessary to take measures against permeation of water or oxygen through the adhesive from the adhered portion, and in this sense, the role of a desiccant is also important.

In view of the technical background described above, in the sealing method, there are known: (1) a solid sealing film made of a dense inorganic oxide or inorganic nitride; (2) a desiccant of a physical absorption type such as zeolite or porous silica gel; and (3) a desiccant of a chemically reactive type which removes water molecules by immediately chemically reacting with water molecules such as alkaline earth metal oxides or metal hydrides.

The manufacturing method (1) is characterized in that it is manufactured by vacuum deposition typified by vapor deposition, sputtering, CVD (Chemical Vapor Deposition), and ALD (Atomic Layer Deposition), and is excellent in water vapor barrier property because a plurality of dense films can be formed, but on the other hand, the manufacturing method requires a large-sized device and is unsuitable for continuous production such as roll-to-roll, so that the manufacturing cost is high and the problem is large for mass and inexpensive production.

On the other hand, the method for removing the water molecules of (2) and (3) can be selectively used depending on the allowable moisture concentration of the device, but in general, the desorption phenomenon of water molecules cannot be avoided if the adsorption mechanism is the chemical equilibrium between water and adsorbent, such as silica gel, zeolite, montmorillonite of (2), and the method cannot be applied to organic thin film solar cells or organic EL elements that require a high degree of water molecule removal.

The method (3) typified by barium oxide, or strontium oxide has excellent ability as a desiccant because it has high reactivity with water molecules, but has many problems such as immediate reaction with water at atmospheric pressure, deterioration in performance, and the attendant risk of heat generation, and the effect is temporary and unsuitable for long-term storage because only stoichiometric amounts of water can be captured in the device.

As an example of a chemical reaction type desiccant, a desiccant using water absorption by hydrolysis has been proposed (for example, see Patent Document 1). However, the disclosed alumina ring trimer still has a low water vapor barrier property for application to a sealing film of an electronic device.

PRIOR ART DOCUMENTS

Patent Document

Patent Document 1: JP-A No. 2005-000792

SUMMARY OF THE INVENTION

Problems to be Solved by the Invention

The present invention has been made in view of the above problems and circumstances, and an object of the present invention is to provide a method for manufacturing an electronic device including an organic thin film which functions as a sealing film against moisture permeation with respect to an electronic device such as an organic electroluminescent element.

Means to Solve the Problems

In order to solve the above-mentioned problems, the present inventor has found a new desiccant composed of an organometallic oxide which is a chemical reaction type desiccant and which can release a hydrophobic substance which prevents the transmission of moisture by the amount of reaction, and has found that by containing the desiccant, an organic thin film functioning as a sealing film against moisture permeation for an electronic device such as an organic electroluminescent element can be obtained.

Further, in the electronic device having the organic functional layer, the elution preventing film, and the sealing film in this order, when the organic thin film is applied as the sealing film, it has been found that the surface treatment is performed on the silicone resin by vacuum ultraviolet light to change the surface composition to $SiO_2$, thereby improving the affinity with the inorganic oxide and greatly improving the adhesion with the sealing film containing the organometallic oxide. Thus, the present invention has been achieved.

That is, the present inventors have tried to create a technique capable of realizing the following phenomena in order to overcome the above-mentioned problems.
(I) To be provided with a drying property (desiccant property) that reacts with water molecules.
(II) To release a substance that has a property of repelling water as a function of its reaction with water.
(III) To be capable of forming a coating film under atmospheric pressure.

If materials and technologies can be constructed that combine these three elements, the penetration of water molecules can be effectively prevented in the heart of the electronic device, water-repellent materials can be produced in accordance with the amount of water that has penetrated, thereby preventing the penetration of water vapor under a new technical idea completely different from conventional water vapor barrier properties, and if coating can be performed under atmospheric pressure, sealing may be made inexpensively and over a large area, and it is considered that there is a possibility that a hidden problem (i.e., inexpensive and effective sealing) that actually became a bottleneck in manufacturing cost toward the IoT age coming from now on may be solved at once.

That is, the above-mentioned problem according to the present invention is solved by the following means.

1. A method of manufacturing an electronic device having at least an organic functional layer, an elution preventing film, and a sealing film in this order, comprising the steps of: forming the elution preventing film by irradiating vacuum ultraviolet rays after applying a silicone resin; and applying a mixed solution of a metal alkoxide and a fluorinated alcohol on the elution preventing film and then irradiating vacuum ultraviolet rays to form the sealing film.
2. The method for manufacturing an electronic device according to item 1, wherein in the step of forming the elution preventing film, a siloxane-based solvent is mixed and applied to a silicone resin.
3. The method for manufacturing an electronic device according to item 2, wherein the siloxane-based solvent is a cyclic siloxane-based solvent.
4. The method for manufacturing an electronic device according to item 2 or 3, wherein a content in mass of the siloxane-based solvent is in the range of 1 to 30 times of a content in mass of the silicone resin.
5. The method for manufacturing an electronic device according to any one of items 1 to 4, wherein a wet film thickness after application of the elution preventing film is 10 μm or less.
6. The method for manufacturing an electronic device according to any one of items 1 to 5, wherein in the step of forming the elution preventing film, a radiation dose of the vacuum ultraviolet ray is in the range of 0.1 to 10 $J/cm^2$.
7. The method for manufacturing an electronic device according to any one of items 1 to 6, wherein in the step of forming the sealing film, a radiation dose of the vacuum ultraviolet ray is in the range of 0.1 to 10 $J/cm^2$.

Effects of the Invention

According to the above-mentioned means of the present invention, it is possible to provide a method for manufacturing an electronic device including an organic thin film functioning as a sealing film against moisture permeation for an electronic device such as an organic electroluminescent element.

In the present invention, the sealing film may be referred to as an "organic thin film" and the elution preventing film may be referred to as an "other organic thin film".

The expression mechanism or action mechanism of the effect of the present invention is not clarified, but is inferred as follows.

The desiccant according to the present invention and the organic thin film containing the desiccant function as a chemical reaction type getter agent. Further, it is a new desiccant and a sealing film for preventing permeation of water, which releases a hydrophobic substance by an amount corresponding to the reaction with water (moisture). Specifically, the organometallic oxide having the structure represented by Formula (1) described later is hydrolyzed to produce an equal mole of fluorinated alcohol with quenched water molecules, which has a water repellent function, thereby preventing further penetration of water. Therefore, it is an innovative technology that has a characteristic not found in conventional desiccants and organic thin films, in which the effect of preventing the penetration of moisture is extremely high than that of conventional desiccant-type desiccants. That is, in addition to the drying property (desiccant property) of the single composition film, the water-repellent function is added by the reaction with moisture to exhibit a synergistic effect (synergy effect). This is an innovative technology with features not found in conventional desiccants and organic thin films.

The organic thin film containing the desiccant according to the present invention may be formed, for example, by using a metal alkoxide solution as a raw material, and synthesizing an organic-inorganic hybrid compound by hydrolysis of a metal alkoxide and a subsequent polycondensation reaction, which is generally called a sol-gel method.

In addition to sealing, a sol-gel method is widely known as a conventional means for forming a film of an inorganic oxide by a coating method. In this method, generally, a metal alkoxide solution is used as a raw material, and an inorganic oxide is formed by hydrolysis of the metal alkoxide followed by a polycondensation reaction, and when a part of the metal alkoxide is not an alkoxy group but an alkyl group or an aryl group, the group is retained even after the sol-gel reaction, so that an organic-inorganic hybrid compound film based on the inorganic oxide may be formed.

Basically, all metal elements which can be alkoxylated may be applied to this sol-gel method, but in practice, gelation occurs when the solution is made in the air, and most of the cases cannot be applied, and only silicon (tetraalkoxysilane) is practically used. The reason for this is that, when the metal element is titanium or zirconium, the alkoxide compound itself is Lewis acid, which catalytically accelerates the dehydration polycondensation reaction after the hydrolysis reaction, and gelation occurs immediately. Further, in the case of alkali metal or alkaline earth metal, since alkoxide is basic, the first hydrolysis reaction is very fast, while the dehydration polycondensation reaction is slow, so that it is difficult to obtain an organometallic oxide. Since silicon alkoxide has intermediate properties, it is only suitable for the synthesis of organic oxides or the formation of organometallic oxide thin films by the sol-gel method.

On the other hand, when the metal alkoxide is dissolved in an excess of alcohol (A), the metal alkoxide is replaced with (A) from the chemical equilibrium to form the metal (A) alkoxide. At this time, when (A) is an alcohol substituted with a fluorine atom, the resulting metal fluorinated alkyloxy compound (hereinafter referred to as "metal fluorinated alkoxide") can moderate the sol-gel reaction rate. This is because, although the electron density on the metal element is lowered by the electron attraction effect of the fluorine atom and the nucleophilic reaction of the water molecule is accelerated, the effect of elimination of water by the fluorine atom is larger than this acceleration by the fluorine atom, and the water molecule does not approach the metal element. Consequently, the so-called frequency factor is greatly lowered, and as a result, the hydrolysis rate is slowed, and an acid catalytic effect is exhibited because an alkoxide compound of, for example, titanium, zirconium, or a transition metal having an empty d orbital (for example, tetravalent vanadium or tetravalent tungsten) is a Lewis acid, and an organometallic oxide having a high molecular weight is apt to be generated because the dehydrogenation condensation reaction or dealcohol polycondensation reaction is accelerated.

This effect makes it possible to satisfy all of the above-mentioned (I) to (III). In particular, with respect to (II), even if the usual metal alkoxide could not be handled substantially due to the progress of gelation, but it becomes possible to handle in the presence of the fluorinated alcohol. And by applying high energy such as ultraviolet light, plasma irradiation, or microwave irradiation to the resulting film, a high density organic metal oxide film is formed continuously from the surface of the thin film. As a result, the thin film has a drying property (desiccant property) of (I), and further, since unreacted metallized alkoxide remains inside, it exhibits the effect of (II) because it reacts with incoming water to form fluorinated alcohol. Therefore, it becomes possible to form a new thin film having the effects of (I) and (II) together.

Further, metal alkoxides substituted with fluorinated alcohols can also effectively suppress the reaction and salt formation between different metal alkoxides because the frequency factor is reduced due to the elimination effect of fluorine atoms. Alternatively, a plurality of metal alkoxides can coexist in a solution as a metal fluoride alkoxide, and a thin film obtained from the solution can give a mixed inorganic oxide thin film. This may be said as one of the present invention.

For example, titanium tetraisopropoxide and barium dibutoxide, which usually form Lewis acid/Lewis base pairs and to form gel, do not form gel even when they are diluted in a large excess of tetrafluoropropanol (TFPO) and then mixed, but can be applied as they are to form a thin film by the sol-gel method, and a mixed organometallic oxide film may be formed by applying high-energy such as ultraviolet rays to the thin film.

That is, the present invention is not limited to a desiccant that simply produces a water-repellent compound, but a plurality of metal alkoxides which have conventionally been difficult to coexist are stably present, and the resulting mixed organometallic oxide thin film itself falls into the category of the present invention. This is a technique which has not been realized in practice, although it is likely to be realized in the past, and the realization of this technology is expected to exert a function which has not been achieved so far in various application areas, and the positive influence of the present invention on the industry is great.

Therefore, the present invention is to be distinguished from the similar prior art because the thin film formation by the sol-gel method using the conventional metal alkoxide is different in concept, the function of the formed thin film is different, and furthermore, a mixture organometallic oxide thin film, which has not been possible heretofore, is realized.

On the other hand, the following patent reports a technique of a sealing film formed by coating an inorganic oxide on an organic electroluminescent element and an elution preventing film for preventing penetration of a solvent used therein (JP-A 2015-225785). However, the above technique does not disclose a specific embodiment, and it is considered that the adhesion between the elution preventing film and the sealing film made of an inorganic oxide is inferior when estimated from the materials used for the elution preventing film and the sealing film. As a result, a defect occurs at the interface between the elution preventing film and the sealing film, thereby impairing the intrinsic gas barrier property or causing a problem such as peeling when bent. Further, in the above-mentioned elution preventing film, since the surface (interface with the sealing film) is not flat, unevenness occurs in the covering property of the sealing film, and the inherent gas barrier property of the sealing film cannot be ensured, resulting in a problem that dark spots occur in the element.

On the other hand, by subjecting the silicone resin used for the elution prevention film according to the present invention to a surface treatment with vacuum ultraviolet light (also referred to as VUV), the surface composition changes to $SiO_2$, and the silicone resin is converted to $SiO_2$. The affinity is improved, and the adhesion to the sealing film can be greatly improved. In addition, since organic matter on the surface is decomposed and removed by VUV, the flatness of the surface can be improved. It is inferred that these effects make it possible to provide a method for manufacturing an electronic device which is greatly improved in sealing property and bendability over the prior art.

BRIEF DESCRIPTION OF THE DRAWINGS

FIG. 3 is a cross-sectional view indicating a solar cell composed of an organic photoelectric conversion element having a tandem bulk heterojunction layer;

FIG. 4A is a diagram indicating an exemplary configuration of an organic thin film transistor;

FIG. 4B is a diagram indicating another exemplary configuration of the organic thin film transistor;

FIG. 9 is a cross-sectional view of an organic EL element used in the embodiment;

FIG. 10 is an evaluation standard diagram of a grid tape test.

EMBODIMENTS TO CARRY OUT THE INVENTION

Figure 1:
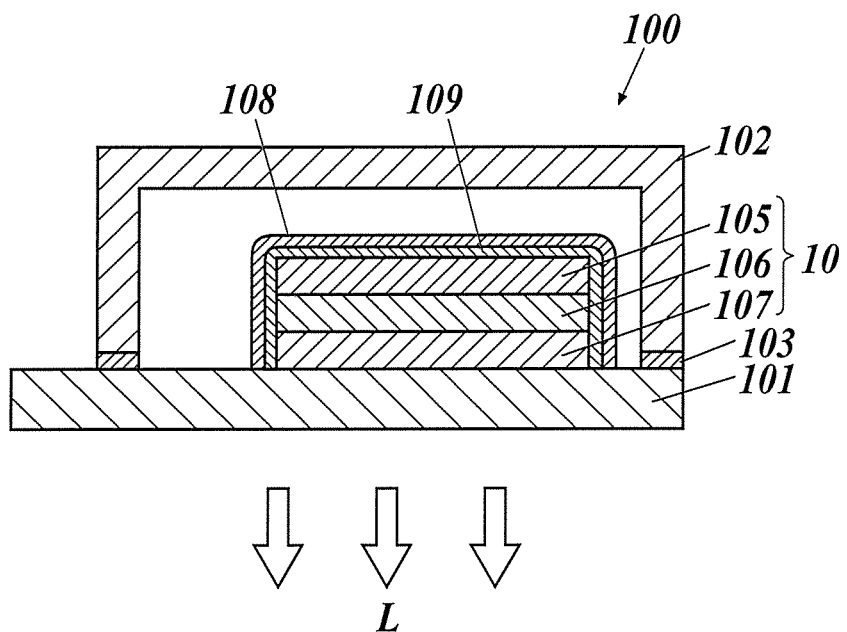
FIG. 1 is a schematic cross-sectional view indicating an example of a configuration of an organic EL element which is an electronic device of the present invention.

The method for manufacturing an electronic device of the present invention is a method for manufacturing an electronic device having at least an organic functional layer, an elution preventing film, and a sealing film in this order, characterized in that it has a step of forming the elution preventing film by irradiating a vacuum ultraviolet ray after applying a silicone resin, and a step of applying a mixed liquid of a metal alkoxide and a fluorinated alcohol on the elution preventing film and then irradiating the vacuum ultraviolet ray to form the sealing film. This feature is a technical feature common to or corresponding to each embodiment.

In the embodiment of the present invention, from the viewpoint of expressing the effect of the present invention, in the step of forming the elution preventing film, it is preferable that the siloxane-based solvent is mixed with a silicone resin and applied, and it is more preferable that the siloxane-based solvent is a cyclic siloxane-based solvent.

The silicone resin generally has a high viscosity in many cases, and is easily thickened at the time of film formation. As a result, when the VUV surface treatment is performed, a difference in structure change between the inside and the surface is large. As a result, cracks occur on the film surface, which adversely affects the elution prevention property and the bending property, and may deteriorate the dark spot resistance of the electronic device.

On the other hand, by using a siloxane-based solvent as a diluent of the silicone resin this time, it is possible to adjust the viscosity, and in particular, by adding a cyclic siloxane-based solvent as a diluent to lower the viscosity, it is possible to further reduce the thickness. As a result, it is considered that crack generation due to thickening, which has been a problem in the past, may be suppressed.

It is preferable that the content (mass) of the siloxane-based solvent be in the range of 1 to 30 times as large as the content of the silicone resin in order to exhibit the above effect, and that the wet film thickness after the application of the elution preventing film be 1 μm or less, from the viewpoint of suppressing the occurrence of cracks.

In the step of forming the elution preventing film, the radiation dose of the vacuum ultraviolet ray is in the range of 0.1 to 10 J/cm$^2$, which is a preferable range from the viewpoint of providing a manufacturing process of electronic devices excellent in adhesion and planarization.

In addition, in the step of forming the sealing film, the radiation dose of the vacuum ultraviolet ray is in the range of 0.1 to 10 J/cm$^2$, which is a preferable range from the viewpoint of adhesion in addition to the sealing performance.

The desiccant according to the present invention is characterized in that it contains a compound which releases a hydrophobic substance by absorbing water.

The organic thin film according to the present invention is characterized in that it contains the desiccant. The organic thin film functions as a thin film having a high sealing property against moisture permeation with respect to an electronic device.

In an embodiment of the present invention, from the viewpoint of expressing the effect of the present invention, it is preferable that the desiccant contained in the organic thin film contains an organometallic oxide, and the organometallic oxide preferably has a structure represented by Formula (1). A thin film having a high sealing property against moisture permeation may be formed by the compound having the structure represented by the following Formula (1). Further, it is preferable that the fluorine ratio of the organic thin film according to the present invention satisfies the following Expression (a), and by increasing the fluorine ratio, it is possible to provide a thin film having a higher sealing property against moisture permeation with respect to an electronic device.

In the following Formula (1), it is preferable that the metal atom represented by M is selected from Ti, Zr, Sn, Ta, Fe, Zn, Si, and Al from the viewpoint of further enhancing the effect of the present invention.

The method for producing an organometallic oxide according to the present invention is characterized in obtaining the effect of the present invention by using a mixed solution of a metal alkoxide or a metal carboxylate and a fluorinated alcohol.

Further, as the method of manufacturing an organic thin film according to the present invention, it is preferable that the method includes a step of manufacturing the organic thin film by a coating method or an inkjet printing method.

Further, it is preferable that the organic thin film of the present invention is provided in the electronic device as an organic laminated film in which another organic thin film is laminated, and when the organic thin film absorbs moisture and releases a hydrophobic compound, the influence of penetration of the compound into the electronic device may be alleviated by the other organic thin film.

The organic thin film or the organic multilayer film according to the present invention is provided in an electronic device, and it is preferable that the electronic device is an organic electroluminescent element, a solar cell using an organic photoelectric conversion element, or an organic thin film transistor from the viewpoint of providing an electronic device in which transmission of moisture from the outside is prevented and performance degradation of the device is suppressed.

Hereinafter, detailed descriptions will be given of the present invention, its constituent elements, and modes and modes for carrying out the present invention. In the present application, "to" is used in the meaning that numerical values described before and after are included as a lower limit value and an upper limit value.

[1] Desiccant

The desiccant according to the present invention is characterized in that it contains a compound which releases a hydrophobic substance by absorbing water.

The desiccant according to the present invention is an alcohol-substituted organometallic oxide or a polycondensate of an organometallic oxide obtained by subjecting a metal alkoxide to alcoholysis in the presence of an excess of alcohol. In this case, by using a long-chain alcohol in which a fluorine atom is substituted in the β position of the hydroxy group, an organometallic oxide containing a fluorinated alkoxide is obtained, which is a desiccant according to the present invention.

On the other hand, the organometallic oxide is sintered or irradiated with ultraviolet rays to accelerate a sol-gel reaction and form a polycondensate. In this case, when a long-chain alcohol in which a fluorine atom is substituted in the β position of the hydroxy group is used, the hydrolysis rate is decreased by decreasing the frequency factor of moisture existing around the metal in the metal alkoxide due to the water repellent effect of fluorine, and this phenomenon is used to suppress a three-dimensional polymerization reaction, and a uniform and dense organic thin film containing a desired organometallic oxide will be formed.

The organometallic oxide contained in the desiccant according to the present invention is shown in the following Reaction Scheme I. In the structural formula of the polycondensate of the organometallic oxide after sintering, "M" in the "O-M" part further has a substituent, but is omitted.

Reaction Scheme 1

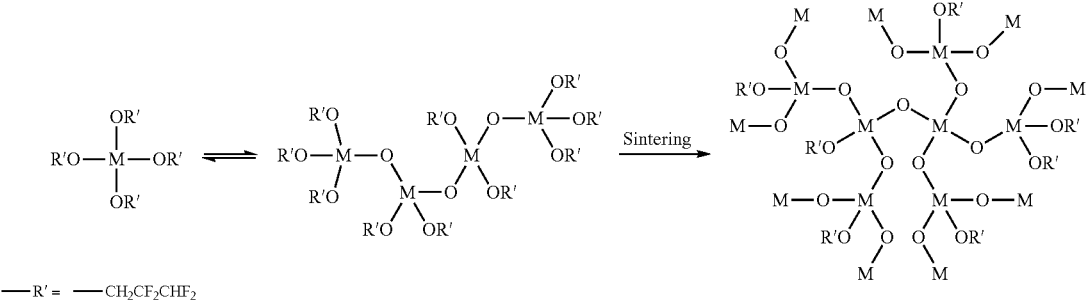

—R' = —CH$_2$CF$_2$CHF$_2$

The organic thin film formed by polycondensation of the above-mentioned organometallic oxide by sintering or UV radiation is hydrolyzed by moisture (H$_2$O) from the outside of the system according to the following Reaction Scheme II, and a fluorinated alcohol (R'—OH) which is hydrophobic materials is released. The fluorinated alcohol further passivates moisture from penetrating into the interior of the electronic device.

That is, the desiccant according to the present invention has a characteristic that the fluoride alcohol produced by hydrolysis exhibits a synergistic effect (synergistic effect) on the sealing property by adding a water repellent function by reaction with moisture in addition to the original drying property (desiccant property) because of water repellency.

In the following structural formula, "M" of "O-M" part further has a substituent, but is omitted.

Reaction Scheme II

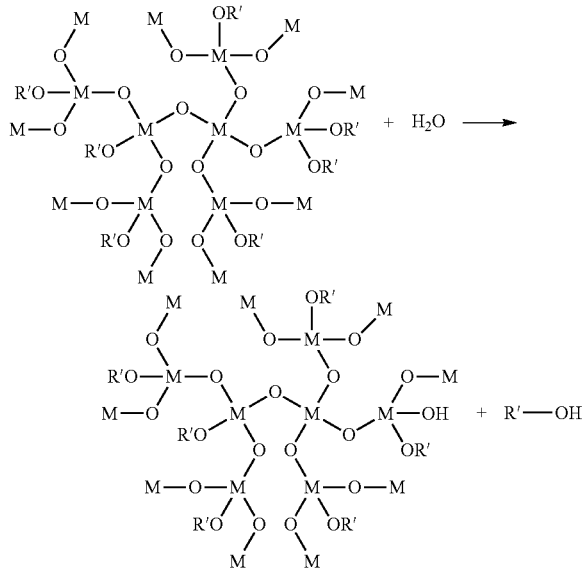

The desiccant according to the present invention preferably contains an organometallic oxide having a structure represented by the following Formula (1) as a main component. The "main component" means that 70% by mass or more of the total mass of the desiccant is preferably the organometallic oxide that releases a hydrophobic substance, more preferably 80% by mass or more, and particularly preferably 90% by mass or more.

R-[M(OR$_1$)$_y$(O—)$_{x-y}$]$_n$—R    Formula (1):

(In the Formula, R represents hydrogen atoms, an alkyl group having 1 or more carbon atoms, an alkenyl group, an aryl group, a cycloalkyl group, an acyl group, an alkoxy group, or a heterocyclic group, where R may be a carbon chain containing a fluorine atom as a substituent, where M represents a metal atom, OR, represents a fluorinated alkoxy group, x represents a metal valence, y represents any integer between 1 and x, and n represents a degree of polycondensation, respectively.) Further, it is preferable that the fluorine ratio in the organic thin film according to the present invention satisfies the following Expression (a).

$0.05 \leq F/(C+F) \leq 1$    Expression (a):

The measurement meaning of Expression (a) is to quantify that an organic thin film produced by the sol-gel method requires a certain amount or more of fluorine atoms. F and C in the above Expression (a) represent the densities of fluorine atoms and carbon atoms, respectively.

A preferable range of Expression (a) is:

$0.2 \leq F/(C+F) \leq 0.6$.

The fluorine ratio may be obtained by coating a sol-gel solution used for forming an organic thin film on a silicon wafer to produce a thin film, and then analyzing the thin film with an element by SEM-EDS (Energy Dispersive X-ray Spectoroscopy: Energy-dispersive X-ray analyzer) to obtain the densities of fluorine atoms and carbon atoms, respectively. As an example of the SEM/EDS device, JSM-IT100 (manufactured by Nippon Electronics Co., Ltd.) may be cited.

The SEM/EDS analysis is characterized by high-speed, high-sensitivity, and high-precision detection of elements.

The organic metal oxide according to the present invention is not particularly limited as long as it is produced by the sol-gel method, and for example, a metal oxide containing one or more metals selected from metals introduced in "Science of Sol-Gel Method" P13, P20, lithium, sodium, copper, calcium, strontium, barium, zinc, boron, aluminum, gallium, yttrium, silicon, germanium, lead, phosphorus, antimony, vanadium, tantalum, tungsten, lanthanum, neodymium, titanium, and zirconium may be cited as an example. Preferably, the metal atom represented by M is selected from titanium (Ti), zirconium (Zr), tin (Sn), tantalum (Ta), iron (Fe), zinc (Zn), silicon nitride (Si), and aluminum (Al), from the viewpoint of obtaining the effect of the present invention.

In the above Formula (1), OR$_1$ represents a fluorinated alkoxy group.

R$_1$ represents an alkyl group, an aryl group, a cycloalkyl group, an acyl group, an alkoxy group, or a heterocyclic group substituted with at least one fluorine atom. Specific examples of each substituent will be described later.

R represents a hydrogen atom, an alkyl group having one or more carbon atoms, an alkenyl group, an aryl group, a cycloalkyl group, an acyl group, an alkoxy group, or a heterocyclic group. Alternatively, at least a part of the hydrogen of each group may be substituted with halogen. It may also be a polymer.

The alkyl group may be substituted or unsubstituted, and specific examples include: a methyl group, an ethyl group, a propyl group, a butyl group, a sec-butyl group, a tert-butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an icosyl group, a heneicosyl group, and a docosyl group. The groups having 8 or more carbon atoms are preferable. Further, these oligomers and polymers may also be used.

The alkenyl group may be substituted or unsubstituted, and specific examples include: a vinyl group, an allyl group, a butenyl group, a pentenyl group, a hexysenyl and group. The groups having 8 or more carbon atoms are preferable. Further, these oligomers and polymers may also be used.

The aryl group may be substituted or unsubstituted, and specific examples include: a phenyl group, a tril group, a 4-cyanophenyl group, a biphenyl group, an o, m, p-terphenyl groups, a naphthyl group, an anthranil group, a phenanthrenyl group, a fluorenyl group, a 9-phenylanthranil group, a 9,10-diphenylanthranil group, and a pyrenyl group. The groups having 8 or more carbon atoms are preferable. Further, these oligomers and polymers may also be used.

Specific examples of a substituent or unsubstituted alkoxy group include: a methoxy group, an n-butoxy group, a tert-butoxy group, a trichloromethoxy group, and a trifluoromethoxy group. The groups having 8 or more carbon atoms are preferable. Further, these oligomers and polymers may also be used.

Specific examples of a substituted or unsubstituted cycloalkyl group include: a cyclopentyl group, a cyclohexyl group, a norbonan group, an adamantane group, a 4-methylcyclohexyl group, and a 4-cyanocyclohexyl group. The groups having 8 or more carbon atoms are preferable. Further, these oligomers and polymers may also be used.

Specific examples of a substituent or unsubstituted heterocyclic group include: a pyrrole group, a pyrroline group, a pyrazole group, a pyrazoline group, an imidazole group, a triazole group, a pyridine group, a pyridazine group, a pyrimidine group, a pyrazine group, a triazine group, an indole group, a benzimidazole group, a purine group, a quinoline group, an isoquinoline group, a cinnoline group, a quinoxaline group, a benzoquinoline group, a fluorenone group, a dicyanofluorenone group, a carbazole group, an oxazole group, an oxadiazole group, a thiazole group, a thiadiazole group, a benzoxazole group, a benzothiazole group, a benzotriazole group, a bisbenzoxazole group, a bisbenzothiazole group, and a bisbenzimidazole group. These oligomers and polymers may also be used.

Specific examples of a substituted or unsubstituted acyl group include: a formyl group, an acetyl group, a propionyl group, a butyryl group, an isobutyryl group, a valeryl group, a pivaloyl group, a lauroyl group, a myristoyl group, a palmitoyl group, a stearoyl group, an oxalyl group, a malonyl group, a succinyl group, a glutaryl group, an adipoyl group, a pimeroyl group, a suberoyl group, an azelaoyl group, a sebacolic group, an acryloyl group, a propioyl group, a methacryloyl group, a benzoyl group, a phthaloyl group, an isophthaloyl group, a terephthaloyl group, a naphthoyl group, a toluoyl group, a hydroatropoyl group, an atropoyl group, a cinnamoyl group, a furoyl group, a tenoyl group, a nicotinoyl group, an isonicotinoyl group, a glycoloyl group, a lactoyl group, a glyceroyl group, a tartronoyl group, a maloyl group, a tartaroyl group, a tropoyl group, a benzyloyl group, a salicyloyl group, an anisoyl group, a vanilloyl group, a veratroyl group, a piperoniloyl group, a protocatequoyl group, a galloyl group, a glyoxyloyl group, a pyruvoyl group, an acetoacetyl group, a mesooxalyl group, a mesooxalo group, an oxalacetyl group, an oxalaceto group, and a levulinoyl group. These acyl groups may be substituted by fluorine, chlorine, bromine, or iodine. The groups having 8 or more carbon atoms are preferable. Further, these oligomers and polymers may also be used.

Specific combinations of metal alkoxides, metal carboxylates, and fluorinated alcohols for forming the organometallic oxide having the structure represented by Formula (1) according to the present invention are exemplified below. However, the present invention is not limited to them.

The metal alkoxides, metal carboxylates, and fluorinated alcohols (R'—OH) are formed into organometallic oxides according to the present invention by the following Reaction Scheme III. Here, (R'—OH) is exemplified by the following structures F-1 to F-16.

Reaction Scheme III

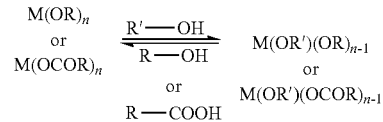

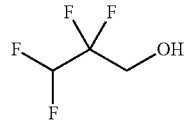

F-1

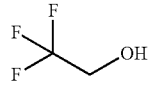

F-2

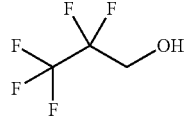

F-3

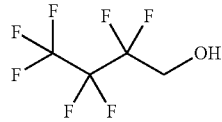

F-4

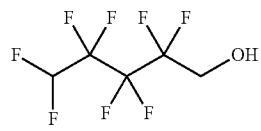

F-5

-continued

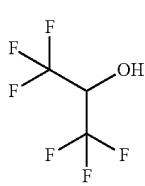
F-6

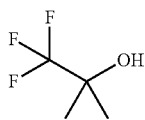
F-7

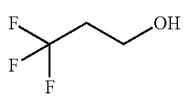
F-8

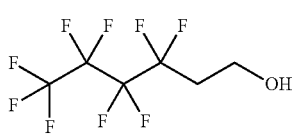
F-9

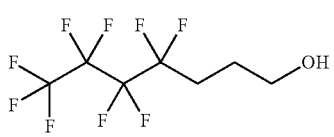
F-10

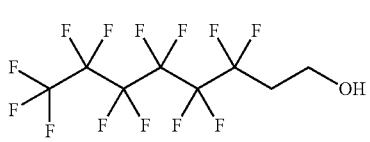
F-11

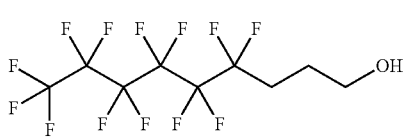
F-12

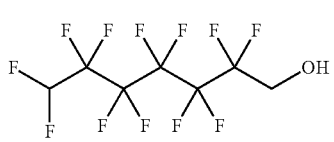
F-13

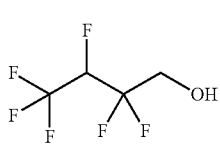
F-14

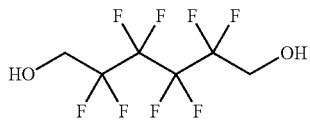
F-15

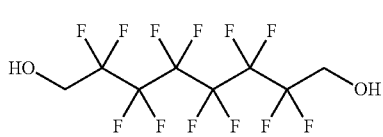
F-16

The metal alkoxides or metal carboxylates according to the present invention are exemplified by compounds represented by the $M(OR)_n$ or $M(OCOR)_n$, and the organometallic oxides according to the present invention are combined with the above (R'—OH: F-1 to F-16) to be compounds having structures of the following exemplified compounds Nos. 1 to 135 (see exemplified compounds I, II and III). The organometallic oxide according to the present invention is not limited thereto.

| (Exemplified Compounds I) | | |
|---|---|---|
| Exemplified Compound Number | M (OR) n | R'—OH |
| 1 | Ti (OiPr)4 | F - 1 |
| 2 | Ti (OiPr)4 | F - 2 |
| 3 | Ti (OiPr)4 | F - 3 |
| 4 | Ti (OiPr)4 | F - 4 |
| 5 | Ti (OiPr)4 | F - 5 |
| 6 | Ti (OiPr)4 | F - 6 |
| 7 | Ti (OiPr)4 | F - 7 |
| 8 | Ti (OiPr)4 | F - 8 |
| 9 | Ti (OiPr)4 | F - 9 |
| 10 | Ti (OiPr)4 | F - 10 |
| 11 | Ti (OiPr)4 | F - 11 |
| 12 | Ti (OiPr)4 | F - 12 |
| 13 | Ti (OiPr)4 | F - 13 |
| 14 | Ti (OiPr)4 | F - 14 |
| 15 | Ti (OiPr)4 | F - 15 |
| 16 | Ti (OiPr)4 | F - 16 |
| 17 | Ti (OEt)4 | F - 1 |
| 18 | Ti (OEt)4 | F - 2 |
| 19 | Ti (OEt)4 | F - 3 |
| 20 | Ti (OEt)4 | F - 4 |
| 21 | Ti (OEt)4 | F - 5 |
| 22 | Ti (OEt)4 | F - 6 |
| 23 | Ti (OEt)4 | F - 7 |
| 24 | Ti (OEt)4 | F - 8 |
| 25 | Ti (OEt)4 | F - 9 |
| 26 | Ti (OEt)4 | F - 10 |
| 27 | Ti (OEt)4 | F - 11 |
| 28 | Ti (OEt)4 | F - 12 |
| 29 | Ti (OEt)4 | F - 13 |
| 30 | Ti (OEt)4 | F - 14 |
| 31 | Ti (OEt)4 | F - 15 |
| 32 | Ti (OEt)4 | F - 16 |
| 33 | Ti (OBu)4 | F - 1 |
| 34 | Ti (OBu)4 | F - 2 |
| 35 | Ti (OBu)4 | F - 3 |
| 36 | Ti (OBu)4 | F - 4 |
| 37 | Ti (OBu)4 | F - 5 |
| 38 | Ti (OBu)4 | F - 6 |
| 39 | Ti (OBu)4 | F - 7 |
| 40 | Ti (OBu)4 | F - 8 |
| 41 | Ti (OMe)4 | F - 1 |
| 42 | Ti (OMe)4 | F - 2 |
| 43 | Ti (OMe)4 | F - 5 |
| 44 | Ti (OMe)4 | F - 13 |
| 45 | Ti (OMe)4 | F - 15 |

| (Exemplified Compounds II) | | |
|---|---|---|
| Exemplified Compound Number | M (OR) n | R'—OH |
| 46 | Zr (OiPr)4 | F - 1 |
| 47 | Zr (OiPr)4 | F - 2 |
| 48 | Zr (OiPr)4 | F - 5 |
| 49 | Zr (OiPr)4 | F - 13 |
| 50 | Zr (OiPr)4 | F - 15 |
| 51 | Sn (OtBu)4 | F - 1 |
| 52 | Sn (OtBu)4 | F - 2 |
| 53 | Sn (OtBu)4 | F - 5 |
| 54 | Sn (OtBu)4 | F - 13 |
| 55 | Sn (OtBu)4 | F - 15 |
| 56 | Si (OEt)4 | F - 1 |
| 57 | Si (OEt)4 | F - 2 |
| 58 | Si (OEt)4 | F - 5 |
| 59 | Si (OEt)4 | F - 13 |
| 60 | Si (OEt)4 | F - 15 |
| 61 | Si (OBu)4 | F - 1 |
| 62 | Si (OBu)4 | F - 2 |
| 63 | Si (OBu)4 | F - 5 |
| 64 | Si (OBu)4 | F - 13 |
| 65 | Si (OBu)4 | F - 15 |

(Exemplified Compounds II)

| Exemplified Compound Number | M (OR) n | R'—OH |
|---|---|---|
| 66 | Ta (OEt)5 | F - 1 |
| 67 | Ta (OEt)5 | F - 2 |
| 68 | Ta (OEt)5 | F - 5 |
| 69 | Ta (OEt)5 | F - 13 |
| 70 | Ta (OEt)5 | F - 15 |
| 71 | Yb (OiPr)3 | F - 1 |
| 72 | Yb (OiPr)3 | F - 2 |
| 73 | Yb (OiPr)3 | F - 5 |
| 74 | Yb (OiPr)3 | F - 13 |
| 75 | Yb (OiPr)3 | F - 15 |
| 76 | Y (OiPr)3 | F - 1 |
| 77 | Y (OiPr)3 | F - 2 |
| 78 | Y (OiPr)3 | F - 5 |
| 79 | Y (OiPr)3 | F - 13 |
| 80 | Y (OiPr)3 | F - 15 |
| 81 | Al (OiPr)3 | F - 1 |
| 82 | Al (OiPr)3 | F - 2 |
| 83 | Al (OiPr)3 | F - 5 |
| 84 | Al (OiPr)3 | F - 13 |
| 85 | Al (OiPr)3 | F - 15 |
| 86 | Al (OEt)3 | F - 1 |
| 87 | Al (OEt)3 | F - 2 |
| 88 | Al (OEt)3 | F - 5 |
| 89 | Al (OEt)3 | F - 13 |
| 90 | Al (OEt)3 | F - 15 |

(Exemplified Compounds III)

| Exemplified Compound Number | M (OCOR) n | R'—OH |
|---|---|---|
| 91 | Zn (OCOCH$_3$)$_2$•2H$_2$O | F - 1 |
| 92 | Zn (OCOCH$_3$)$_2$•2H$_2$O | F - 2 |
| 93 | Zn (OCOCH$_3$)$_2$•2H$_2$O | F - 5 |
| 94 | Zn (OCOCH$_3$)$_2$•2H$_2$O | F - 13 |
| 95 | Zn (OCOCH$_3$)$_2$•2H$_2$O | F - 15 |
| 96 | Co (OCOCH$_3$)$_2$ | F - 1 |
| 97 | Co (OCOCH$_3$)$_2$ | F - 2 |
| 98 | Co (OCOCH$_3$)$_2$ | F - 5 |
| 99 | Co (OCOCH$_3$)$_2$ | F - 13 |
| 100 | Co (OCOCH$_3$)$_2$ | F - 15 |
| 101 | In (OCOCH$_3$)$_3$ | F - 1 |
| 102 | In (OCOCH$_3$)$_3$ | F - 2 |
| 103 | In (OCOCH$_3$)$_3$ | F - 5 |
| 104 | In (OCOCH$_3$)$_3$ | F - 13 |
| 105 | In (OCOCH$_3$)$_3$ | F - 15 |
| 106 | Fe (OCOCH$_3$)$_2$ | F - 1 |
| 107 | Fe (OCOCH$_3$)$_2$ | F - 2 |
| 108 | Fe (OCOCH$_3$)$_2$ | F - 5 |
| 109 | Fe (OCOCH$_3$)$_2$ | F - 13 |
| 110 | Fe (OCOCH$_3$)$_2$ | F - 15 |
| 111 | Mo (OCOCH$_3$)$_2$ | F - 1 |
| 112 | Mo (OCOCH$_3$)$_2$ | F - 2 |
| 113 | Mo (OCOCH$_3$)$_2$ | F - 5 |
| 114 | Mo (OCOCH$_3$)$_2$ | F - 13 |
| 115 | Mo (OCOCH$_3$)$_2$ | F - 15 |
| 116 | Ni (OCOCH$_3$)$_2$•4H$_2$O | F - 1 |
| 117 | Ni (OCOCH$_3$)$_2$•4H$_2$O | F - 2 |
| 118 | Ni (OCOCH$_3$)$_2$•4H$_2$O | F - 5 |
| 119 | Ni (OCOCH$_3$)$_2$•4H$_2$O | F - 13 |
| 120 | Ni (OCOCH$_3$)$_2$•4H$_2$O | F - 15 |
| 121 | Pd (OCOCH$_3$)$_2$ | F - 1 |
| 122 | Pd (OCOCH$_3$)$_2$ | F - 2 |
| 123 | Pd (OCOCH$_3$)$_2$ | F - 5 |
| 124 | Pd (OCOCH$_3$)$_2$ | F - 13 |
| 125 | Pd (OCOCH$_3$)$_2$ | F - 15 |
| 126 | Ag (OCOCH$_3$) | F - 1 |
| 127 | Ag (OCOCH$_3$) | F - 2 |
| 128 | Ag (OCOCH$_3$) | F - 5 |
| 129 | Ag (OCOCH$_3$) | F - 13 |
| 130 | Ag (OCOCH$_3$) | F - 15 |
| 131 | Sr (OCOCH$_3$)$_2$ | F - 1 |
| 132 | Sr (OCOCH$_3$)$_2$ | F - 2 |
| 133 | Sr (OCOCH$_3$)$_2$ | F - 5 |
| 134 | Sr (OCOCH$_3$)$_2$ | F - 13 |
| 135 | Sr (OCOCH$_3$)$_2$ | F - 15 |

The method for producing an organometallic oxide according to the present invention is characterized in that it is produced using a mixture of a metal alkoxide and a fluorinated alcohol.

As an example of the reaction, the reaction scheme IV of Exemplified Compound No. 1 and the structure of the organometallic oxide when applied to an organic thin film are shown below.

In the structural formulae below, "Ti" in the part of "O—Ti" further has a substituent, but is omitted.

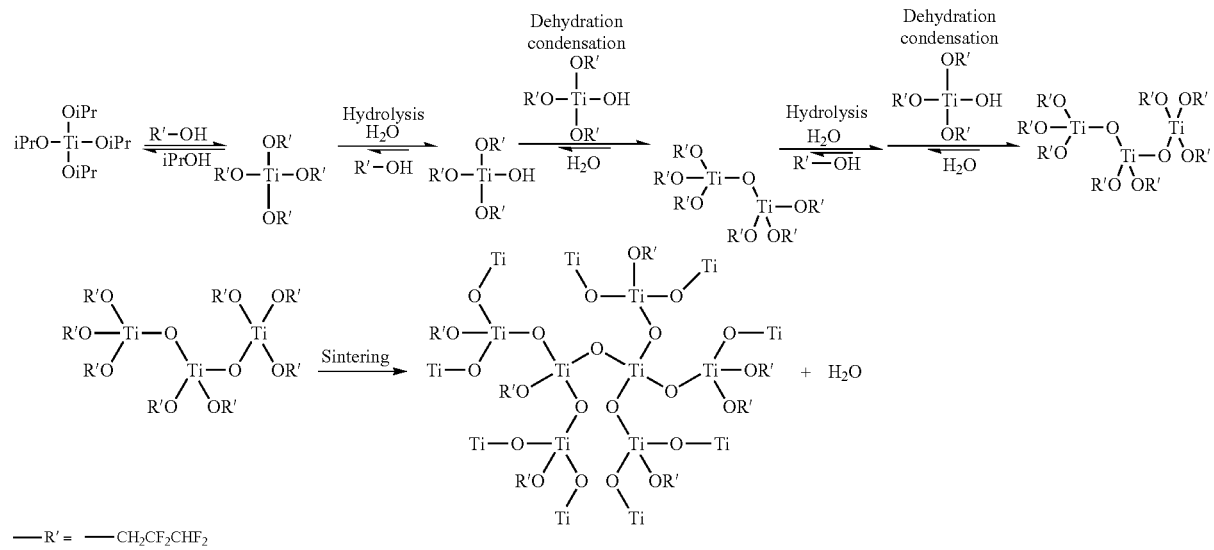

Reaction Scheme IV

—R' = —CH$_2$CF$_2$CHF$_2$

The method for producing an organometallic oxide according to the present invention may include a method in which a fluorinated alcohol is added to a metal alkoxide or a metal carboxylate, the mixture is stirred and mixed as a mixed solution, and then water and a catalyst are added as necessary to react at a predetermined temperature.

When the sol-gel reaction is carried out, in order to accelerate the hydrolysis and polycondensation reaction, a catalyst which can be a catalyst of the hydrolysis and polymerization reaction as shown below may be added. The catalyst used as a catalyst for the hydrolysis/polymerization reaction of the sol-gel reaction is a catalyst used in the general sol-gel reaction as described in "Advanced Sol-Gel Method Functional Thin Film Preparation Technology" (Hiroshi Hirashima, Research and Development Center, Inc., p. 29) and "Sol-Gel Method Sciences" (Sumio Sakka, AGNE Shofuusya, P154). For example, in the case of an acid catalyst, inorganic and organic acids such as hydrochloric acid, nitric acid, sulfuric acid, phosphoric acid, acetic acid, oxalic acid, tartaric acid, and toluenesulfonic acid; in the case of an alkali catalyst, alkali metal hydroxides such as ammonium hydroxide, potassium hydroxide, and sodium hydroxide, tetramethylammonium hydroxide, tetraethylammonium hydroxide, quaternary ammonium hydroxide such as tetrabutylammonium hydroxide, amines such as ammonia, triethylamine, tributylamine, morpholine, pyridine, piperidine, ethylenediamine, diethylenetriamine, ethanolamine, diethanolamine, triethanolamine, aminosilanes such as 3-aminopropyltriethoxysilane and N(2-aminoethyl)-3-aminopropyltrimethoxysilane are cited.

The amount of the catalyst used is preferably 2 mol equivalent or less, more preferably 1 mol equivalent or less, with respect to 1 mol of the metal alkoxide or metal carboxylate used as the raw material of the organometallic oxide. When the sol-gel reaction is performed, the preferable amount of water added is 40 mol equivalent or less, more preferably 10 mol equivalent or less, and even more preferably 5 mol equivalent or less, with respect to 1 mol of metal alkoxide or metal carboxylate used as a raw material of the organometallic oxide.

In the present invention, the reaction concentration, the temperature, and the time of the sol-gel reaction are not generally described because the kind and the molecular weight of the metal alkoxide or the metal carboxylate used are mutually related. That is, when the reaction temperature is set to be high or the reaction time is excessively long in the case where the molecular weight of the alkoxide or the metal carboxylate is high or the reaction concentration is high, the molecular weight of the reaction product may increase along with the hydrolysis or polycondensation reaction, resulting in high viscosity or gelation. Therefore, the usual preferred reaction concentration is approximately 1 to 50% by mass of the solid content in the solution, more preferably 5 to 30%. The reaction temperature is usually from 0 to 150° C., preferably from 1 to 100° C., more preferably from 20 to 60° C., and preferably from 1 to 50 hours, depending on the reaction time.

The polycondensate of the organometallic oxide forms an organic thin film, and absorbs moisture to release fluorinated alcohol, which is a hydrophobic substance, according to the following reaction scheme V.

In the structural formulae below, "Ti" in the part of "O—Ti" further has a substituent, but is omitted.

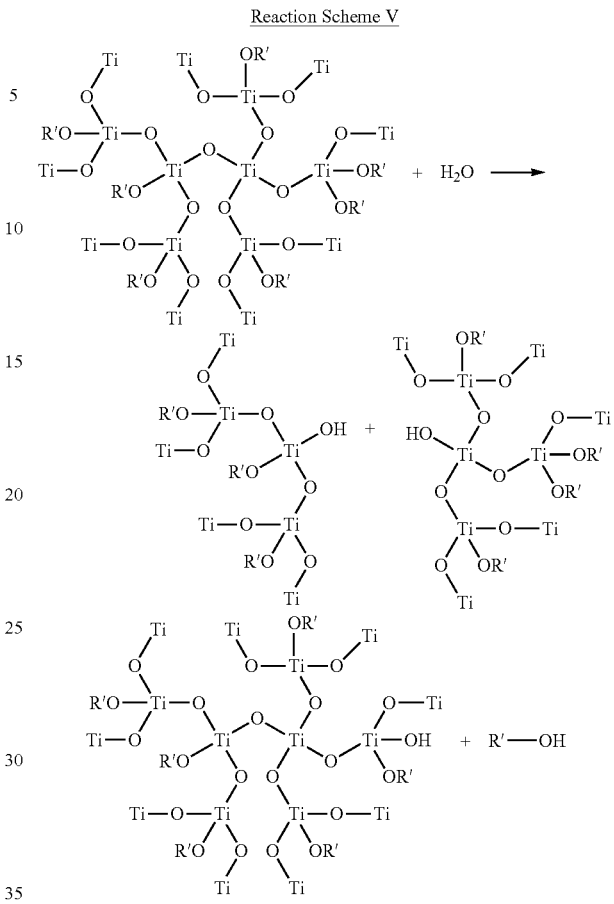

Reaction Scheme V

[2] Organic Thin Film

The organic thin film according to the present invention is preferably an organic material for an electronic device. The "organic thin film" may be referred to as a "sealing film" because of its function. However, it is a member different from the "sealing member" of an electronic device such as a gas barrier film or glass, which will be described later.

The sealing film according to the present invention is formed by a manufacturing method including a step of applying a mixed solution of a metal alkoxide and a fluorinated alcohol onto an elution preventing film, which will be described later, and then irradiating a vacuum ultraviolet ray to form the sealing film.

Examples of the electronic device include organic EL elements, light emitting diodes (Light Emitting Diode: LEDs), liquid crystal elements, photovoltaic cells (photoelectric converters), touch panels, and color filters for liquid crystal displays. In particular, in the present invention, it is preferable that the electronic device is an organic EL element, a solar cell, or a light-emitting diode in view of the effect of the present invention.

In the present invention, an organic material for an electronic device means a solid component of an organic material and does not contain an organic solvent.

[2.1] Examples of the Use of Organic Thin Films

As an example of use of the organic thin film according to the present invention, an example in which the organic thin film is provided in an organic EL element will be described.

FIG. 1 is a schematic cross-sectional view indicating an example of a configuration of an organic EL element according to an electronic device of the present invention.

In the organic EL element (100), a cathode (105), an organic functional layer group (106), and a transparent electrode (anode 107) are laminated on a substrate (101) to form an element (10).

The organic thin film (108) according to the present invention is formed so as to cover the element (10), and although it is not essential, it is preferable that another organic thin film (109) is present between the organic thin film (108) according to the present invention and the element (10) to form a laminated film.

The glass cover or gas barrier film (102) is filled with nitrogen gas, and the glass cover or gas barrier film (102) and the substrate (101) are fixed by an adhesive (103).

In the organic thin film (108) according to the present invention, when the organometallic oxide contained therein is hydrolyzed by moisture permeated from the adhesive (103) into the device interior, the fluorinated alcohol is generated in an equimolar mole with the quenched water molecules, and since the water-repellent function is provided, further penetration of water is prevented.

The other organic thin film (109) is preferably an elution preventing film having a blocking function for preventing the generated fluorinated alcohol from penetrating into the element (10).

[2.2] Details of Organic Thin Film

The organic thin film according to the present invention contains, as a main component, the desiccant which releases a hydrophobic substance by absorbing water. The "main component" means that 70% by mass or more of the total mass of the organic thin film is preferably the desiccant, more preferably 80% by mass or more, and particularly preferably 90% by mass or more.

The organic thin film according to the present invention can be formed by preparing a coating solution containing the desiccant according to the present invention, coating the coating solution on an electronic device, and coating the coating solution while sintering or irradiating with ultraviolet rays to cause polycondensation.

As the organic solvent that may be used when preparing the coating solution, for example, a hydrocarbon solvent such as an aliphatic hydrocarbon, an alicyclic hydrocarbon, an aromatic hydrocarbon, a halogenated hydrocarbon solvent, an ether such as an aliphatic ether or an alicyclic ether may be used as appropriate.

The concentration of the drying agent (organometallic oxide) according to the present invention in the coating solution varies depending on the target thickness and the pot life of the coating solution, but is preferably about 0.2 to 35 mass %. It is also preferable to add a catalyst for promoting polymerization to the coating solution.

Examples of the coating method of the prepared application solutions include: a wet forming method such as a spray coating method, a spin coating method, a blade coating method, a dip coating method, a casting method, a roll coating method, a bar coating method, a die coating method, or a patterning method such as a printing method including an inkjet printing method. These can be used depending on the material. Among these, an inkjet printing method is preferable. The inkjet printing method is not particularly limited, and a known method may be employed.

The ejection method of the coating liquid from the inkjet head by the inkjet printing method may be either the on-demand method or the continuous method. An on-demand inkjet head may be either an electrical-mechanical conversion method such as a single-cavity type, double-cavity type, vendor type, piston type, share mode type and shared wall type, or an electric-heat conversion method such as a thermal inkjet type and a bubble jet (registered trademark) type.

In order to immobilize the organic thin film after coating, it is preferable to use plasma, ozone or ultraviolet rays capable of polymerization reaction at a low temperature, and among ultraviolet rays, the use of vacuum ultraviolet rays (referred to as VUV) is a feature of the present invention, and the smoothness of the surface of the thin film is improved.

Examples of the means for generating ultraviolet rays in the vacuum ultraviolet treatment include a metal halide lamp, a high-pressure mercury lamp, a low-pressure mercury lamp, a xenon arc lamp, a carbon arc lamp, an excimer lamp, and a UV light laser, but excimer lamps are preferably used although not particularly limited thereto.

Ultraviolet irradiation is compatible with both batch processing and continuous processing, and may be appropriately selected depending on the shape of the base material used. In the case where the base material forming the organic thin film is in the form of a long film, it may be carried out by continuously irradiating ultraviolet rays in a drying zone provided with the ultraviolet ray generating source as described above while conveying the base material. The time required for ultraviolet irradiation is generally from 0.1 second to 10 minutes, preferably from 0.5 second to 3 minutes, depending on the composition and concentration of the base material and the coating solution containing the desiccant used.

From the viewpoint of forming a uniform and robust thin film, it is preferable that the radiation dose of the vacuum-ultraviolet ray be within the range of 0.1 to 10 $J/cm^2$ as the energy received by the coating film surface. Among these, 1 $J/cm^2$ or more is more preferable, and 2 $J/cm^2$ or more is more preferable. Further, similarly, from the viewpoint of avoiding excessive ultraviolet irradiation, it is preferable that 8 $J/cm^2$ or less among them, more preferably not more than 6 $J/cm^2$, it is more preferable that 4 $J/cm^2$ or less.

In addition, the oxygen concentration at the time of irradiation with vacuum ultraviolet rays (VUV) is preferably 300 to 10,000 volume ppm (1 volume %) and more preferably 500 to 5,000 volume ppm. By adjusting the oxygen concentration within such a range, it is possible to prevent the organic thin film from becoming excessively oxygen-rich and to prevent deterioration of moisture absorption.

It is preferable to use a dry inert gas as a gas other than the oxygen at the time of irradiation with vacuum ultraviolet rays (VUV), and in particular, it is preferable to use a dry nitrogen gas from the viewpoint of cost.

For details of the vacuum ultraviolet treatment, for example, the contents described in paragraphs 0055 to 0091 of JP-A No. 2012-086394, paragraphs 0049 to 0085 of JP-A No. 2012-006154, and paragraphs 0046 to 0074 of JP-A No. 2011-251460 may be referred to.

When the organic thin film according to the present invention is left in an environment of 60° C. and 90% RH for 1 hour, it is preferable to measure the contact angle of pure water under an atmosphere of 23° C. in order to estimate how much fluorine atoms are oriented on the surface of the organic thin film, and when the contact angle after leaving at this time is increased as compared with the contact angle before leaving, the water repellency is further improved and the sealing property against moisture permeation is enhanced.

[Measurement of Contact Angle]

The contact angle may be measured by the following method with reference to the droplet method described in p 52-53 of "Basics and Theory of Adhesion" (Nikkan Kogyo Shimbun Co., Ltd.).

Specifically, the contact angle of pure water on the interfaces of the organic thin films is measured by dropping 1 μL of pure water to the samples of the organic thin films before and after being left at 60° C. and 90% RH for 1 hour on the basis of JIS-R3257 in an atmosphere of 23° C. and 55% RH using a contact angle meter (trade name: DropMaster DM100, manufactured by Kyowa Interface Scientific Co., Ltd.) and measuring the contact angle after 1 minute. In the measurement, 10 points are measured at equal intervals in the direction of the width of the organic thin film, and the average value except for the maximum value and the minimum value is defined as the contact angle.

The thickness of the organic thin film according to the present invention is preferably in the range of 10 nm to 100 μm in the dry film, more preferably in the range of 0.1 to 1 μm in order to exhibit the effect as the sealing film.

[3] Other Organic Thin Film

In the organic thin film according to the present invention, it is preferable that the organic thin film and other organic thin films are laminated adjacent to each other to form an organic laminated film.

The other organic thin film is a thin film having a function of preventing the fluoride alcohol, which is released from the organic thin film according to the present invention by absorbing moisture, from eluting and penetrating into the inside of the electronic device and affecting the light emission inhibition such as generation of dark spots. Hereinafter, the "other organic thin film" will be described as the "elution preventing film".

The elution preventing film according to the present invention is formed by a step of applying vacuum ultraviolet rays after applying a silicone resin to form the elution preventing film.

The elution preventing film is formed by coating. As a material to be formed by coating, a thermal curing type or UV curing type solvent-free monomer is preferable, and particularly, a curing type silicone monomer is preferable. After the solvent-free monomer is applied, a solid thin film is formed by thermal curing and/or UV curing to form an elution preventing film.

A getter agent that absorbs moisture and oxygen may be mixed in the elution preventing film.

It is preferable to dispose the prepared coating liquid between the electronic device (organic functional layer) and the organic thin film according to the present invention, and similarly to the above-mentioned organic thin film, it is preferable to apply the coating liquid by a wet forming method such as a spray coating method, a spin coating method, a blade coating method, a dip coating method, a casting method, a roll coating method, a bar coating method, a die coating method, or a patterning method such as a printing method including an inkjet printing method. Among these, an inkjet printing method is preferable.

The thickness of the elution preventing film is preferable in the range of 10 nm to 100 μm, more preferably 0.1 to 1 μm, in the dry film in order to exhibit the effect as the elution preventing film.

The elution preventing film preferably contains a silicone resin from the viewpoint of expressing the elution prevention function, and polydimethylsiloxane, polymethylphenylsiloxane, or polydiphenylsiloxane may be used as the silicone resin. Furthermore, siloxanes containing fluorine atoms may also be suitably used.

The silicone resin used for the elution preventing film according to the present invention may be a low molecular body or a high molecular body. Particular preference is given to oligomers and polymers, and specific examples include polysiloxane polymers such as polysiloxane compounds, polydimethylsiloxane compounds, and polydimethylsiloxane copolymers. Further, these compounds may be combined.

The compound having the polysiloxane skeleton has a structure represented by the following Formula (I), and the effect of preventing elution may be arbitrarily controlled by changing the number of repetitions n (a number of 1 or more) and the type of the organic modification portion in Formula (I).

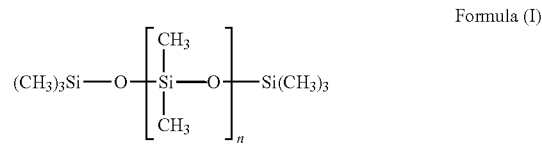

Formula (I)

As an example of changing the type of n or the organic modification portion in the above Formula (I), for example, a structure represented by the following Formula (II) (x and y are 1 or more and m is an integer of 1 or more representing the number of repetitions) may be given, and the silicone skeleton may be modified by giving a side chain. The $R^1$ in Formula (II) includes, for example, a methyl group, an ethyl group, and a decyl group. Examples of $R^2$ include a polyether group, a polyester group, and an aralkyl group.

In addition, compounds having structures represented by the following Formula (III) (m is an integer of 1 or more) may also be used, and the silicone chain is composed of several Si—O bonds, and has an average of one polyether chain corresponding to $R^3$.

As described above, in any of the compounds having the structure represented by Formula (II) and the compounds having the structure represented by Formula (III), the control of the surface free energy and the adjustment of the compatibility may be arbitrarily performed.

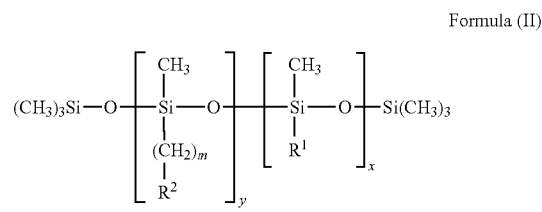

Formula (II)

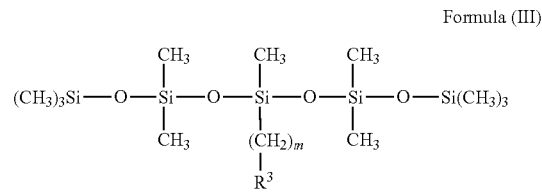

Formula (III)

(Polysiloxane-Based Compounds)

Examples of polysiloxane-based compounds include: a partial hydrolyzate of silane compounds having hydrolyzable silyl groups such as tetramethoxysilane, tetraethoxysilane, methyltrimethoxysilane, methyltoxysilane, dimethyldimethoxysilane, dimethyldipropyltriethoxysilane, γ-glycidoxypropyltriethoxysilane, γ-glycidoxypropyldimethoxysilane, γ-glycidoxypropyldiethoxysilane, γ-methacryloxypropyltrimethoxysilane, γ-methacryloxypropyltrimethoxysilane, partial hydrolysates of silane compounds containing hydrolyzable silyl groups, such as γ-acryloxypropyl methyldimethoxysilane; an organosilica sol in which fine particles of silicic anhydride are stably dispersed in an organic solvent; and a product obtained by adding the silane compound having radical polymerizability to the organosilica sol.

(Polydimethylsiloxane-Based Compounds)

Examples of the polydimethylsiloxane-based compound include: polydimethylsiloxane, alkyl-modified polydimethylsiloxane, carboxy-modified polydimethylsiloxane, amino-modified polydimethylsiloxane, epoxy-modified polydimethylsiloxane, fluorine-modified polydimethylsiloxane, and meth-acrylate-modified polydimethylsiloxane (for example, GUV-235 manufactured by Toa Synthesis Co., Ltd.).

(Polydimethylsiloxane Copolymer)

The polydimethylsiloxane copolymer may be any of a block copolymer, a graft copolymer, and a random copolymer, but a block copolymer and a graft copolymer are preferable.

(Commercial Materials)

The commercially available material is not particularly limited as long as it has a silicon atom, and the following materials may be used, for example.

Produced by Kyoei Chemical Co., Ltd.: GL-01, GL-02R, GL-03, and GL-04R;

Produced by Nisshin Chemical Co., Ltd.: Silface SAG002, Silface SAG005, Silface SAG008, Silface SAG503A, Surfinol 104E, Surfinol 104H, Surfinol 104A, Surfinol 104BC, Surfinol 104DPM, Surfinol 104PA, Surfinol 104PG-50, Surfinol 104S, Surfinol 420, Surfinol 440, Surfinol 465, Surfinol 485, and Surfinol SE;

Produced by Shin-Etsu Chemical Co., Ltd.: FA-600, KC-895, KR-500, KR-516, X-40-9296, KR-513, X-22-161A, X-22-162C, X-22-163, X-22-163A, X-22-164, X-22-164A, X-22-173BX, X-22-174ASX, X-22- 176DX, X-22-343, X-22-2046, X-22-2445, X-22-3939A, X-22-4039, X-22-4015, X-22-4272, X-22-4741, X-22- 4952, X-22-6266, KF-50-100cs, KF-96L-lcs, KF-101, KF-102, KF-105, KF-351, KF-352, KF-353, KF-354L, KF-355A, KF-393, KF-615A, F-618, KF-857, KF-859, KF-860, KF-862, KF-877, KF-889, KF-945, KF-1001, KF-1002, KF-1005, KF-2012, KF-2201, X-22-2404, X-22-2426, X-22-3710, KF-6004, KF-6011, KF-6015, KF-6123, KF-8001, KF-8010, KF-8012, and X-22-9002;

Produced by Toray Dow Corning Co., Ltd.: DOW CORNING 100F ADDITIVE, DOW CORNING 11 ADDITIVE, DOW CORNING 3037 INTERMEDIATE, DOW CORNING 56 ADDITIVE, DOW CORNING TORAY Z-6094, DOW CORNING TORAY FZ-2104, DOW CORNING TORAY AY42-119, and DOW CORNING TORAY FZ-2222;

Produced by Kao Co., Ltd.: Emulgen 102KG, Emulgen 104P, Emulgen 105, Emulgen 106, Emulgen 108, Emulgen 109P, Emulgen 120, Emulgen 123P, Emulgen 147, Emulgen 210P, Emulgen 220, Emulgen 306P, Emulgen 320P, Emulgen 404, Emulgen 408, Emulgen 409PV, Emulgen 420, Emulgen 430, Emulgen 705, Emulgen 707, Emulgen 709, Emulgen 1108, Emulgen 1118S-70, Emulgen 1135S-70, Emulgen 2020G-HA, Emulgen 2025G, Emulgen LS-106, Emulgen LS-110, and Emulgen LS114.

It is preferable that the compound is contained within the range of 0.005 to 5% by mass with respect to all components except the solvent in the material constituting the elution preventing film.

In the step of forming the elution preventing film according to the present invention, it is preferable to apply a siloxane-based solvent mixed with a silicone resin from the viewpoint of suppressing the occurrence of cracks due to thickening, and it is preferable that the siloxane-based solvent is a cyclic siloxane-based solvent.

Examples of the siloxane-based solvent include, but are not limited to, cyclic siloxanes, chain siloxanes such as alkylsiloxanes, and polyether-modified siloxanes.

The cyclic siloxane is not particularly limited, and for example, a cyclic siloxane represented by the following Structure formula (1) is given.

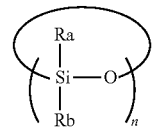

Structure formula (1)

(In Structure formula (1), n is an integer of any of 3 to 19, and Ra and Rb are each independently a hydrogen atom or a methyl group.)

Each of Ra and Rb is preferably a methyl group. That is, the cyclic siloxane represented by Structure formula (1) is preferably cyclic dimethyl siloxane.

Examples of the ring dimethyl siloxane include hexamethylcyclotrisiloxane, octamethylcyclotetrasiloxane, and decamethylcyclopentasiloxane.

In Structure formula (1), n is preferably from 3 to 8, more preferably from 4 to 6.

The chain siloxane is not particularly limited, and for example, an alkylsiloxane represented by the following Structure formula (2) can be given.

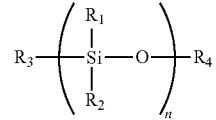

Structure formula (2)

(In Structure formula (2), n is an integer of any of 2 to 19, and $R_1$ to $R_4$ are each independently a hydrogen atom, a methyl group, a phenyl group, or a benzyl group.)

In Structure formula (2), $R_1$ and $R_2$ may be independent for each Si atom to be bonded.

Preferably, at least one of $R_1$ and $R_2$ is a methyl group. That is, it is preferable that the chain siloxane represented by Structure formula (2) is alkylsiloxane.

Preferably, $R_1$ and $R_2$ are each methyl groups. $R_3$ and $R_4$ are each preferably a methyl group. That is, Structure formula (2) is preferably an alkylsiloxane in which $R_1$ to $R_4$ are methyl groups.

Examples of chain siloxanes represented by Structure formula (2) include: dimethyl polysiloxane, methylphenyl polysiloxane, methylhydrogensiloxane, and phenylpolysiloxane.

In Structure formula (2), n is preferably 2 to 18, more preferably 3 to 6. More preferred are hexamethylcyclotrisiloxane, octamethylcyclotetrasiloxane, decamethylcyclopentasiloxane, and dodecamethylcyclohexasiloxane.

It is preferable that the content (mass) of the siloxane-based solvent is in the range of 1 to 30 times as large as the content of the silicone resin from the viewpoint of adjusting the viscosity of the silicone resin-containing coating liquid. More preferably, it is in the range of 2 to 15 times.

In addition, it is preferable that the wet film thickness after the application of the elution preventing film is 1 μm or less from the viewpoint of suppressing crack generation at the time of VUV irradiation. Preferably, it is in the range of 0.1 to 0.5 μm.

As in the case of the sealing film, in the step of forming the elution preventing film, it is preferable that the irradiation dose of the vacuum ultraviolet ray is within the range of 0.1 to 10 $J/cm^2$ from the viewpoint of forming a uniform and robust thin film as the energy received by the surface of the coating film. Among these, 1 $J/cm^2$ or more is more preferable, and 2 $J/cm^2$ or more is more preferable. Further, similarly, from the viewpoint of avoiding excessive ultraviolet irradiation, it is preferable that 8 $J/cm^2$ or less among them, more preferably not more than 6 $J/cm^2$, it is more preferable that 4 $J/cm^2$ or less.

[4] Electronic Device

As an example of an organic thin film and an electronic device including an organic laminated film of the organic thin film and another organic thin film according to the present invention, an organic EL display device including an organic EL element, a photoelectric conversion element, and a solar cell will be described.

[4.1] Organic EL Display Device

[Organic EL Element]

An organic EL element suitable for use in the present invention has, on a substrate, an anode and a cathode, and one or more organic functional layers (also referred to as "organic EL layer" and "organic compound layer") sandwiched between these electrodes.

(Substrate)

The substrate which may be used for the organic EL element (hereinafter, also referred to as a substrate, a supporting substrate, a base material, or a supporting substrate) is not particularly limited, and a glass substrate, or a plastic substrate may be used, and may be transparent or opaque. When light is extracted from the substrate side, the substrate is preferably transparent. Examples of the transparent substrate preferably used include glass, quartz, and transparent plastic substrates.

In order to prevent oxygen or water from entering the substrate, the substrate preferably has a thickness of 1 μm or more and a water vapor permeability of 1 $g/(m^2 \cdot 24h \cdot atm)$ (25° C.) or less in a test based on JIS Z-0208.

Specific examples of the glass substrate include alkali-free glass, low alkali glass, and soda lime glass. Alkali-free glass is preferable from the viewpoint of small moisture adsorption, but any of these may be used as long as sufficient drying is performed.

Plastic substrates have recently attracted attention because of their high flexibility, light weight, and resistance to cracking, and because of their ability to further reduce the thickness of organic EL elements.

The resin film used as the base material of the plastic substrate is not particularly limited. Examples thereof include: polyester such as polyethylene terephthalate (PET), polyethylene naphthalate (PEN), polyethylene, polypropylene, cellophane, cellulose diacetate, cellulose triacetate (TAC), cellulose acetate butyrate, cellulose acetate propionate (CAP), cellulose acetate phthalate, cellulose nitrate, etc., or derivatives thereof, polyvinylidene chloride, polyvinyl alcohol, polyethylene vinyl alcohol, syndiotactic polystyrene, polycarbonate, norbornene resin, polymethyl sulfone, polyether, polyphenesulfone, polyether, polyphenylene sulfonate, etc. polyetherketonimide, polyamide, fluoropolymer, nylon, polymethylmethacrylate, acrylic or polyarylates, and organic-inorganic hybrid resins.

Examples of the organic-inorganic hybrid resin include those obtained by combining an organic resin and an inorganic polymer obtained by a sol-gel reaction, for example, silica, alumina, titania, or zirconia. Among these, a norbornene (or cycloolefin based) resin such as Arton (manufactured by JSR Corporation) or Apel (manufactured by Mitsui Chemicals Corporation) is particularly preferable.

Usually produced plastic substrates have relatively high moisture permeability and may contain moisture inside the substrate. Therefore, when such a plastic substrate is used, it is preferable that a barrier film (also referred to as a "gas barrier film" or a "water vapor sealing film") for suppressing entry of water vapor or oxygen is provided on the resin film to form a gas barrier film.

The material of the barrier film is not particularly limited, and an inorganic material, an organic material coating, or a hybrid of both is used. A coating may be formed, preferably a barrier film having a moisture vapor transmission rate (25±0.5° C., 90±2% RH) of 0.01 $g/(m^2 \cdot 24h)$ or less as measured by a method conforming to JIS K 7129-1992, and preferably a high barrier film having an oxygen transmission rate of $1 \times 10^{-3}$ $mL/(m^2 \cdot 24h \cdot atm)$ or less as measured by a method conforming to JIS K 7126-1987 and a moisture vapor transmission rate of $1 \times 10^{-5}$ $g/(m^2 \cdot 24h)$ or less as measured by a method conforming to JIS K 7126-1987.

The material constituting the barrier film is not particularly limited as long as it has a function of suppressing penetration of moisture or oxygen which causes deterioration of the element, and, for example, an inorganic substance such as a metal oxide, a metal oxynitride, or a metal nitride, an organic substance, or a hybrid material of both may be used.

Examples of the metal oxide, metal oxynitride, or metal nitride include silicon oxide, titanium oxide, indium oxide, tin oxide, indium tin oxide (ITO), metal oxides such as aluminum oxide, metal nitrides such as silicon nitride, and metal oxynitrides such as silicon oxynitride and titanium oxynitride.

Further, in order to improve the fragility of the film, it is more preferable to have a laminated structure of these inorganic layers and layers made of an organic material. The stacking order of the inorganic layer and the organic layer is not particularly limited, but it is preferable that both layers are alternately stacked a plurality of times.

The method of providing the barrier film on the resin film is not particularly limited, and any method may be used; for example, a vacuum evaporation method, a sputtering method, a reactive sputtering method, a molecular beam epitaxy method, a cluster ion beam method, an ion plating method, a plasma polymerization method, an atmospheric pressure plasma polymerization method, a CVD method (for example, a plasma CVD method, a laser CVD method, a thermal CVD method, or the like), a coating method, or a sol-gel method may be used. Among these methods, a method by plasma CVD process at or near atmospheric pressure is preferable from the viewpoint that a dense film may be formed.

Examples of the opaque substrate include a metal plate such as aluminum or stainless steel, a film, an opaque resin substrate, and a ceramic substrate.

(Anode)

As the anode of the organic EL element, a metal having a high work function (4 eV or more), an alloy, an electrically conductive compound of a metal, or a mixture thereof is preferably used as an electrode material.

Here, the "electrically conductive compound of metal" refers to a compound of metal and another substance having electrical conductivity, and specifically refers to, for example, an oxide of metal or a halide having electrical conductivity.

Specific examples of such electrode materials include metals such as Au, conductive transparent materials such as CuI, indium-tin oxide (ITO), $SnO_2$, and ZnO. The anode may be manufactured by forming a thin film of these electrode materials on the substrate by a known method such as evaporation or sputtering.

In addition, a pattern of a desired shape may be formed on the thin film by a photolithography method, or in a case where a pattern accuracy is not required to a large extent (about 100 μm or more), the pattern may be formed through a mask of a desired shape at the time of deposition or sputtering of the electrode material.

When light emission is extracted from the anode, it is desirable that the light transmittance be greater than 10%. The sheet resistance as the anode is preferably several hundred Ω/sq. or less. Further, the film thickness of the anode is usually selected in the range of 10 nm to 1 μm, preferably 10 to 200 nm, depending on the material constituting the anode.

(Organic Functional Layer)

The organic functional layer (also referred to as "organic EL layer" or "organic compound layer") includes at least a light-emitting layer, and the light-emitting layer broadly refers to a layer that emits light when a current is passed through an electrode composed of a cathode and an anode, and specifically refers to a layer containing an organic compound that emits light when a current is passed through an electrode composed of a cathode and an anode.

The organic EL element used in the present invention may have a hole injection layer, an electron injection layer, a hole transport layer, and an electron transport layer in addition to the light-emitting layer, if necessary, and these layers are sandwiched between a cathode and an anode.

Specifically, the following structures are cited.
(i) Anode/light-emitting layer/cathode
(ii) Anode/hole injection layer/light-emitting layer/cathode
(iii) Anode/light-emitting layer/electron injection layer/cathode
(iv) Anode/hole injection layer/light-emitting layer/electron injection layer/cathode
(v) Anode/hole injection layer/hole transport layer/light-emitting layer/electron transport layer/electron injection layer/cathode
(vi) Anode/hole transport layer/light-emitting layer/electron transport layer/cathode.

Further, a cathode buffer layer (e.g., lithium fluoride) may be inserted between the electron injection layer and the cathode, and an anode buffer layer (e.g., copper phthalocyanine) may be inserted between the anode and the hole injection layer.

(Light-Emitting Layer)

The light-emitting layer is a layer that emits light by recombination of electrons and holes injected from an electrode or an electron transport layer or a hole transport layer, and a portion that emits light may be within the layer of the light-emitting layer or at an interface between the light-emitting layer and an adjacent layer. The light-emitting layer may be a layer having a single composition, or may have a multilayer structure including a plurality of layers having the same or different compositions.

The light-emitting layer itself may be provided with functions such as a hole injection layer, an electron injection layer, a hole transport layer, and an electron transport layer. That is, the light-emitting layer may be provided with at least one of the following functions: (1) an injection function capable of injecting holes through the anode or the hole injection layer and injecting electrons from the cathode or the electron injection layer when an electric field is applied; (2) a transport function capable of moving injected charges (electrons and holes) by an electric field force; and (3) a light emitting function of providing a field for recombination of electrons and holes inside the light-emitting layer and connecting the recombination of electrons and holes to light emission. Note that the light-emitting layer may have a difference between the ease of injecting holes and the ease of injecting electrons, and may have a large or small transport function represented by the mobility of holes and electrons; however, it is preferable that the light-emitting layer have a function of transferring at least one of the charges.

The type of the light-emitting material used for this light-emitting layer is not particularly limited, and conventionally known light-emitting materials in organic EL elements may be used. Such a light emitting material is mainly an organic compound, and depending on a desired color tone, for example, a compound described in Macromol. Symp. Vol. 25, pages 17 to 26 may be given. The light-emitting material may be a polymer material such as p-polyphenylenevinylene or polyfluorene. Further, a polymer material having the light emitting material introduced into a side chain or a polymer material having the light emitting material as a polymer main chain may be used.

Note that, as described above, since the light-emitting material may have a hole injection function or an electron injection function in addition to the light-emitting performance, most of a hole injection material or an electron injection material which will be described later may be used as the light-emitting material.

In the layer constituting the organic EL element, when the layer is composed of two or more kinds of organic compounds, the main component is referred to as a host and the other components are referred to as dopants, and when the host and the dopant are used in combination in the light-emitting layer, the mixing ratio of the dopant of the light-emitting layer to the host compound which is the main component (hereinafter also referred to as the light-emitting dopant) is preferably less than 0.1 to 30 mass %.

There are two types of dopants used for the light-emitting layer, namely, a fluorescent dopant that emits fluorescence and a phosphorescent dopant that emits phosphorescence.

Representative examples of the fluorescent dopant include coumarin-based dyes, pyran-based dyes, cyanine-based dyes, croconium-based dyes, squarium-based dyes, oxobenzanthracene-based dyes, fluorescein-based dyes, rhodamine-based dyes, pyrylium-based dyes, perylene-based dyes, stilbene-based dyes, polythiophene-based dyes, rare earth complex-based phosphors, and other known fluorescent compounds.

In the present invention, it is preferable that at least one light emitting-layer contains a phosphorescent compound.

In the present invention, a phosphorescent compound is a compound in which light emission from an excited triplet is observed, and a phosphorescent quantum yield is 0.001 or more at 25° C.

The phosphorescence quantum yield is preferably 0.01 or more, more preferably 0.1 or more. The phosphorescence quantum yield may be measured by the method described on page 398 (1992 edition, Maruzen) of Spectroscopy II of Experimental Chemical Course 7, 4th edition. Although the phosphorescence quantum yield in solution may be measured using various solvents, the phosphorescent compound used in the present invention only needs to achieve the above-mentioned phosphorescent quantum yield in any of the solvents.

The phosphorescent dopant is a phosphorescent compound, a representative example of which is preferably a complex compound containing a metal of group 8 to 10 in the periodic table of the elements, and more preferably an iridium compound, osmium compound, rhodium compound, palladium compound, or platinum compound (platinum complex compound), among which is preferably an iridium compound, rhodium compound, platinum compound, and most preferably an iridium compound.

Examples of the dopant are compounds described in the following documents or patent publications: J. Am. Chem. Soc. Vol. 123, 4304-4312, WO 2000/70655, WO 2001/93642, WO 2002/02714, WO 2002/15645, WO 2002/44189, WO 2002/081488, JP-A 2002-280179, JP-A 2001-181617, JP-A 2002-280180, JP-A 2001-247859, JP-A 2002-299060, JP-A 2002-332292, JP-A 2002-83684, JP-A 2002-540572, JP-A 2002-117978, and JP-A 2002-338588, JP-A 2002-170684, JP-A 2002-50483, JP-A 2002-100476, JP-A 2002-173674, JP-A 2002-359082, JP-A 2002-175884, JP-A 2002-363552, JP-A 2002-184582, JP-A 2003-7469, JP-A 2002-525808, JP-A 2003-7471, JP-A 2002-525833, JP-A 2003-31366, JP-A 2002-2264495, JP-A 2002-234894 JP-A 2002-62824, JP-A 2002-100474, JP-A 2002-203679, JP-A 2002-343572, and JP-A 2002-203678.

Only one type of light-emitting dopant may be used, or a plurality of types may be used, and a light-emitting element having a plurality of light-emitting maximum wavelengths may be configured by simultaneously extracting light emitted from these dopants. For example, both a phosphorescent dopant and a fluorescent dopant may be added. In the case where an organic EL element is formed by stacking a plurality of light-emitting layers, the light-emitting dopants contained in the respective layers may be the same or different, or may be a single type or a plurality of types.

Furthermore, a polymer material in which the light-emitting dopant is introduced into a polymer chain or the light-emitting dopant is used as a main chain of a polymer may be used.

Examples of the host compound include those having a basic skeleton such as carbazole derivatives, triarylamine derivatives, aromatic borane derivatives, nitrogen-containing heterocyclic compounds, thiophene derivatives, furan derivatives, and oligoarylene compounds, and electron transport materials and hole transport materials described later are also suitable examples thereof.

In the case of applying to a blue or white light-emitting element, a display device, and a lighting device, it is preferable that the maximum fluorescence wavelength of the host compound is 415 nm or less, and in the case of using a phosphorescent dopant, it is more preferable that the 0-0 band of phosphorescence of the host compound is 450 nm or less. As the light-emitting host, a compound which has a hole transporting ability and an electron transporting ability and prevents a longer wavelength of light emission and has a high Tg (glass transition temperature) is preferable.

As a specific example of the light emitting host, for example, compounds described in the following documents are suitable.

JP-A 2001-257076, JP-A 2002-308855, JP-A 2001-313179, JP-A 2002-319491, JP-A 2002-334786, JP-A 2002-8860, JP-A 2002-334787, JP-A 2002-15871, JP-A 334788, JP-A 2002-43056, JP-A 334789, JP-A 2002-75645, JP-A 2002-338579, JP-A 2002-34445, JP-A 2002, JP-A 2002-34786, and JP-A 2002-2002 JP-A 2002-231453, JP-A 2003-3165, JP-A 2002-234888, JP-A 2003-27048, JP-A 2002-255934, JP-A 2002-260861, JP-A 2002-280183, JP-A 2002-299060, JP-A 2002-302516, JP-A 2002-305083, JP-A 2002-305084, and JP-A 2002-308837.

The light-emitting dopant may be dispersed throughout the layer containing the host compound or may be partially dispersed. A compound having another function may be added to the light-emitting layer.

The light-emitting layer may be formed by thinning using the above materials by a known method such as a vacuum evaporation method, a spin coating method, a casting method, an LB (Langmuir-Blodgett) method, an inkjet method, or a printing method, and it is particularly preferable that the formed light-emitting layer is a molecularly deposited film.

Here, the molecular deposition film is a thin film deposited and formed from the vapor phase state of the compound, or a film solidified and formed from the molten state or the liquid phase state of the compound. Usually, this molecular deposited film and a thin film (molecular cumulative film) formed by the LB method may be distinguished from each other by a difference between an aggregated structure and a higher-order structure or a functional difference caused by the difference.

In the present invention, it is preferable to use the phosphorescent dopant and the host compound, which are the above-mentioned light-emitting materials, as the organic material for an electronic device of the present invention. That is, it is preferable that the light-emitting layer is formed by coating a solution (composition for manufacturing an electronic device) containing the phosphorescent dopant and the host compound, the organic solvent, and the cellulose nanofibers by spin coating, casting, inkjet, spray, printing, or slot type coater, because the light-emitting layer formed of the molecular deposition film can be formed. Among them, the inkjet printing method is preferable from the viewpoint that a homogeneous film is easily obtained and a pinhole is hardly generated.

In the coating solution containing the phosphorescent dopant, the host compound, the organic solvent, and the cellulose nanofiber, it is preferable that the dissolved carbon dioxide concentration in the organic solvent is 1 ppm to the saturation concentration in the organic solvent under the atmospheric pressure condition at 50° C. or less. Means for setting the dissolved carbon dioxide concentration in the above range include a method of bubbling carbon dioxide gas into a solution containing a phosphorescent dopant, a host compound, and an organic solvent, or a supercritical chromatography method using a supercritical fluid containing an organic solvent and carbon dioxide.

(Hole Injection Layer and Hole Transport Layer)

The hole injection material used for the hole injection layer has either hole injection or electronic barrier properties. The hole transport material used for the hole transport layer has electronic barrier properties and functions to transport holes to the light-emitting layer. Therefore, in the present invention, the hole transport layer is included in the hole injection layer.

The hole injection material and the hole transport material may be an organic substance or an inorganic substance. Specific examples include conductive polymer oligomers such as triazole derivatives, oxadiazole derivatives, imidazole derivatives, polyarylalkane derivatives, pyrazoline derivatives, pyrazolone derivatives, phenylenediamine derivatives, arylamine derivatives, amino-substituent chalcone derivatives, oxazole derivatives, styiylanthracene derivatives, fluorenone derivatives, hydrazone derivatives, stilbene derivatives, silazane derivatives, aniline copolymers, porphyrine compounds, and thiophene oligomers. Of these, arylamine derivatives and porphyrin compounds are preferred.

Among the arylamine derivatives, aromatic tertiary amine compounds and styrylamine compounds are preferable, and aromatic tertiary amine compounds are more preferable.

Representative examples of such aromatic tertiary amine compounds and styrylamine compounds are N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-trilaminophenyl)propane; 1,1-bis(4-di-p-trilaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis (4-di-p-tolylaminophenyl) phenylmethane; N,N'-diphenyl-N,N'-di(4-methoxyphenyl)-4,4'-diaminobiphenyl; N-tetraphenyl-4,4'-diaminodiphenyl ether; 4,4'-bis(diphenylamino)biphenyl; N,N,N-tri(p-tolyl)amine; 4-(di-p-tolylamino)styryl; 4-N,N-diphenylamino-(2-diphenylvinyl)benzene; 3-methoxy-4'-N,N-diphenylaminostyrben; N-phenylcarbazole; and those having two fused aromatic rings in their discs, e.g., 4,4'-bis(N'-phenyl)alpha, described in U.S. Pat. No. 5,061,569. JP-A 4-308688 describes triphenylamine units connected in a three-star burst form, such as 4,4',4"-tris[N-(3-methylphenyl)-N-phenylamino]triphenylamine (MTDATA). Inorganic compounds such as p-type-Si and p-type-SiC may also be used as the hole injection material.

In the present invention, the hole transport material of the hole transport layer preferably has a fluorescence maximum wavelength of 415 nm or less. That is, as the hole transport material, a compound which has a hole transporting ability, prevents a longer wavelength of light emission, and has a high Tg is preferable.

The hole injection layer and the hole transport layer may be formed by thinning the hole injection material and the hole transport material by, for example, a known method such as a vacuum evaporation method, a spin coating method, a casting method, an LB method, an inkjet method, or a printing method.

In the present invention, it is preferable to use the above hole injection material and hole transport material as the organic material for an electronic device of the present invention. Then, the hole injection material and the hole transport material, an organic solvent, a solution containing cellulose nanofiber (composition for electronic device fabrication), by a spin coating method, a casting method, an ink jet method, a spray method, or a printing method, it is preferable to form by applying a slot-type coater method. Among them, the inkjet printing method is preferable from the viewpoint that a homogeneous film is easily obtained and a pinhole is hardly generated.

The thickness of the hole injection layer and the hole transport layer is not particularly limited, but is usually about 5 nm to 5 μm. The hole injection layer and the hole transport layer may have a one-layer structure composed of one kind or two or more kinds of the above materials, respectively, or may have a multilayer structure composed of a plurality of layers having the same composition or different compositions. When both the hole injection layer and the hole transport layer are provided, a different material from the above materials is usually used, but the same material may be used.

(Electron Injection Layer and Electron Transport Layer)

The electron injection layer may have any function as long as it has a function of transmitting electrons injected from the cathode to the light-emitting layer, and any of conventionally known compounds may be selected and used as a material thereof.

Examples of materials used for the electron injection layer (hereinafter also referred to as electron injection materials) include nitro-substituted fluorene derivatives, diphenylquinone derivatives, thiopyrandioxide derivatives, heterocyclic tetracarboxylic anhydrides such as naphthaleneperylene, carbodiimide, freorenylidene methane derivatives, anthraquinodimethane and anthrone derivatives, and oxadiazole derivatives.

Further, a series of electron-transmitting compounds described in JP-A 59-194393 is disclosed as a material for forming a light-emitting layer in the publication, the present inventors as a result of their studies, it has been found that can be used as an electron injection material. Further, in the oxadiazole derivative, a thiadiazole derivative in which an oxygen atom of an oxadiazole ring is substituted with a sulfur atom, or a quinoxaline derivative having a quinoxaline ring known as an electron withdrawing group can also be used as an electron injecting material.

Metal complexes of 8-quinolinol derivatives, such as tris(8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq), and metal complexes in which the central metal of these metal complexes is replaced with In, Mg, Cu, Ca, Sn, Ga, or Pb, can also be used as electron-injection materials.

In addition, metal-free, metal phthalocyanine, or a material whose terminal is substituted with an alkyl group or a sulfonic acid group may be preferably used as the electron injecting material. Like the hole injection layer, an inorganic semiconductor such as n-type-Si or n-type-SiC can also be used as an electron injection material.

The preferable compound used for the electron transport layer preferably has a fluorescence maximum wavelength of 415 nm or less. That is, the compound used for the electron transport layer is preferably a compound which has an electron transporting ability, prevents a longer wavelength of light emission, and has a high Tg.

The electron injection layer may be formed by thinning the electron injection material by, for example, a known method such as a vacuum evaporation method, a spin coating method, a casting method, an LB method, an inkjet method, or a printing method.

In the present invention, it is preferable to use the above-mentioned electron injection material as an organic material for an electronic device of the present invention.

Then, the solution containing the electron injection material, the organic solvent, and the cellulose nanofiber (composition for preparing an electronic device) is preferably subjected to formation of film by a spin coating method, a casting method, an inkjet method, a spray method, a printing method, or a slot-type coater method. Among them, the inkjet method is preferable from the viewpoint that a uniform film is easily obtained and pinholes are hardly generated.

The thickness of the electron injection layer is not particularly limited, but is usually selected in the range of 5 nm to 5 μm. The electron injection layer may have a one-layer structure composed of one kind or two or more kinds of these electron injection materials, or may have a multilayer structure composed of a plurality of layers of the same composition or different kinds of composition.

In this specification, when the ionization energy of the electron injection layer is larger than that of the light-emitting layer, the electron injection layer is particularly referred to as an electron transport layer. Therefore, in the present specification, the electron transport layer is included in the electron injection layer.

The electron transport layer is also referred to as a hole blocking layer, and is described in, for example, WO 2000/70655, JP-A 2001-313178, JP-A 11-204258, and JP-A 11-204359, and page 237 of "Organic EL element and its industrialization front line (issued by NTS Corporation, published Nov. 30, 1998). In particular, in a so-called "phosphorescent light-emitting element" in which an ortho-metal complex dopant is used for a light-emitting layer, it is preferable to adopt a configuration having an electron transport layer (hole blocking layer) as in the above (v) and (vi).

(Buffer Layer)

A buffer layer (electrode interface layer) may be present between the anode and the light-emitting layer or the hole injecting layer, and between the cathode and the light-emitting layer or the electron injecting layer.

The buffer layer is a layer between electrodes and organic layers for driving voltage reduction and luminescence efficiency improvement. It is described in detail in Chapter 2, Electrode Materials (page 123-166) of the second edition of the Organic EL Elements and their Industrialization Frontiers (published Nov. 30, 1998) and includes the anodal buffer layer and the cathodal buffer layer.

The details of the anode buffer layer are also described in JP-A 9-45479, JP-A 9-260062, and JP-A 8-288069, and specific examples include a phthalocyanine buffer layer typified by copper phthalocyanine, an oxide buffer layer typified by vanadium oxide, an amorphous carbon buffer layer, a polymer buffer layer using a conductive polymer such as polyaniline (emeraldine) or polythiophene.

The cathode buffer layer is also described in detail in JP-A 6-325871, JP-A 9-17574, and JP-A 10-74586. Specifically, a metal buffer layer represented by strontium or aluminum, an alkali metal compound buffer layer represented by lithium fluoride, an alkaline earth metal compound buffer layer represented by magnesium fluoride, and an oxide buffer layer represented by aluminum oxide.

The buffer layer is desirably a very thin film, and the thickness thereof is preferably in the range of 0.1 to 100 nm, depending on the material. In addition to the above-mentioned basic constituent layers, layers having other functions may be appropriately stacked as necessary.

(Cathode)

As described above, as the cathode of the organic EL element, a metal having a small work function (less than 4 eV) (hereinafter, referred to as an electronic injecting metal), an alloy, an electrically conductive compound of a metal, or a mixture thereof is generally used as an electrode material.

Specific examples of such electrode materials include sodium, magnesium, lithium, aluminum, indium, rare earth metals, sodium-potassium alloys, magnesium/copper mixtures, magnesium/silver mixtures, magnesium/aluminum mixtures, magnesium/indium mixtures, aluminum/aluminum oxide ($Al_2O_3$) mixtures, and lithium/aluminum mixtures.

In the present invention, the materials listed above may be used as the electrode material of the cathode, but it is preferable that the cathode contains a Group 13 metal element. That is, in the present invention, as described later, the surface of the cathode is oxidized with an oxygen gas in a plasma state to form an oxide film on the surface of the cathode, whereby further oxidation of the cathode may be prevented and durability of the cathode may be improved.

Therefore, the electrode material of the cathode is preferably a metal having a preferable electronic injecting property required for the cathode and capable of forming a dense oxide film.

Specific examples of the electrode material of the cathode containing the Group 13 metallic element include aluminum, indium, a magnesium/aluminum mixture, a magnesium/indium mixture, an aluminum/aluminum oxide ($Al_2O_3$) mixture, and a lithium/aluminum mixture. The mixing ratio of the components of the above mixture may be a conventionally known ratio as the cathode of the organic EL element, but is not particularly limited thereto. The cathode may be manufactured by forming a thin film of the electrode material on the organic compound layer (organic EL layer) by a method such as evaporation or sputtering.

The sheet resistance as the cathode is preferably several hundred Ω/sq. or less, and the film thickness is usually selected in the range of 10 nm to 1 μm, preferably 50 to 200 nm. In order to transmit the emitted light, it is preferable to make either the anode or the cathode of the organic EL element transparent or translucent in order to improve the luminous efficiency.

[Manufacturing Method of Organic EL Element]

As an example of a method of manufacturing an organic EL element, a method of manufacturing an organic EL element composed of an anode, a hole injection layer, a hole transport layer, a light-emitting layer, an electron transport layer, an electron injection layer, and a cathode will be described.

First, a thin film made of a desired electrode material, for example, a material for an anode is formed on a suitable base material by a method such as evaporation or sputtering so as to have a thickness of 1 μm or less, preferably 10 to 200 nm, to produce an anode. Next, an organic compound thin film (organic thin film) of a hole injection layer, a hole transport layer, a light-emitting layer, an electron transport layer, an electron injection layer, and a hole blocking layer, which are element materials, is formed thereon.

As a method for thinning these organic thin films, as described above, there are spin coating, casting, inkjet printing, spraying, vapor deposition, printing, and slot coating, but an inkjet printing method is preferable in that a uniform film is easily obtained and a pinhole is not easily generated, and in the present invention, a composition for manufacturing an electronic device of the present invention can be used.

Alternatively, a different film formation method may be applied to each layer. In the case of employing an evaporation method for film formation, the evaporation conditions differ depending on the type of the compound used, but it is generally preferable to select the evaporation conditions in the range of boat heating temperature of 50 to 450° C., vacuum degree of $10^{-6}$ to $10^{-2}$ Pa, evaporation rate of 0.01 to 50 nm/sec, substrate temperature of −50 to 300° C., and thickness of 0.1 nm to 5 μm.

After these layers are formed, a thin film made of a substance for a cathode is formed thereon to a thickness of 1 μm or less, preferably in the range of 50 to 200 nm, by a method such as evaporation or sputtering, for example, and a cathode is provided, whereby a desired organic EL element is obtained. It is preferable that the organic EL element is manufactured consistently from the hole injection layer to the cathode by one evacuation, but a different film formation method may be performed by taking out the organic EL element in the middle. In this case, it is necessary to take care of performing the operation under a dry inert gas atmosphere.

[Sealing of Organic EL Element]

The sealing means of the organic EL element is not particularly limited, and for example, a method of sealing the outer peripheral portion of the organic EL element with a sealing adhesive and then arranging a sealing member so as to cover the light emitting region of the organic EL element can be cited.

Examples of the sealing adhesive include a photocurable and a thermosetting adhesive having a reactive vinyl group of an acrylic acid oligomer, a methacrylic acid oligomer, and a moisture curable adhesive such as 2-cyanoacrylate acid ester. Further, it is possible to include a thermal and chemical curing type (two-liquid mixing) such as an epoxy system. Also, hot melt type polyamides, polyesters, and polyolefins may be mentioned. In addition, an ultraviolet curable epoxy resin adhesive of a cationic curable type may be mentioned.

As the sealing member, a polymer film and a metal film may be preferably used from the viewpoint of making the organic EL element thinner. In the case of a polymer film, it is preferable to provide the aforementioned gas barrier property.

Examples of the sealing structure include a structure in which a space between the organic EL element and the sealing member is hollow, and a filling and sealing structure in which a sealing material such as an adhesive is filled between the organic EL element and the sealing member.

In addition to the sealing adhesive, an inert gas such as nitrogen or argon, or an inert liquid such as a fluorocarbon or silicone oil may be injected into the gap between the sealing member and the light emitting region of the organic EL element in the gas phase or the liquid phase. In addition, a gap between the sealing member and the display region of the organic EL element may be a vacuum, an inert gas may be sealed in the gap, or a desiccant may be disposed.

[Organic EL Display Device]

In an organic EL display device using the organic EL element described above (hereinafter, also referred to as a display device), if a shadow mask is provided only when a light-emitting layer is formed and the other layers are commonly used, patterning of a shadow mask is unnecessary, and a film may be formed on one surface by an evaporation method, a casting method, a spin coating method, an inkjet method, or a printing method.

When patterning is performed only on the light-emitting layer, the method is not limited, but it is preferable to use a vapor deposition method, an inkjet printing method, or a printing method. In the case of using an evaporation method, patterning using a shadow mask is preferable.

Alternatively, the cathode, the electron injection layer, the electron transport layer, the light-emitting layer, the hole transport layer, the hole injection layer, and the anode may be manufactured in this order by reversing the manufacturing order.

When a DC voltage is applied to the display device thus obtained, light emission can be observed by applying a voltage of about 2 to 40 V with the positive polarity of the anode and the negative polarity of the cathode. In addition, even if a voltage is applied with the opposite polarity, no current flows and no light emission occurs. Further, when an AC voltage is applied, light is emitted only when the anode is in the + state and the cathode is in the − state. The waveform of the applied alternating current may be arbitrary.

The display device may be used as a display device, a display, or various light emitting sources. In the display device and the display, full-color display is possible by using three kinds of organic EL elements of blue, red, and green light emission.

Examples of the display device and the display include a television, a personal computer, a mobile device, an AV device, a teletext display, and an information display in an automobile. In particular, it may be used as a display device for reproducing a still image or a static image, and the driving method for use as a display device for reproducing a moving image may be either a simple matrix method or an active matrix method.

Examples of the light-emitting light source include, but are not limited to, home lighting, in-vehicle lighting, a backlight for a timepiece or a liquid crystal, a signboard advertisement, a traffic light, a light source of an optical storage medium, a light source of an electrophotographic copying machine, a light source of an optical communication processor, and a light source of an optical sensor.

Further, the organic EL element according to the present invention may be used as an organic EL element having a resonator structure.

The purpose of use of the organic EL element having such a resonator structure includes, but is not limited to, a light source of an optical storage medium, a light source of an electrophotographic copying machine, a light source of an optical communication processor, and a light source of an optical sensor. Laser oscillation may also be used in the above applications.

The organic EL element according to the present invention may be used as a kind of lamp such as an illumination light source or an exposure light source, or may be used as a projection device of a type for projecting an image or a display device of a type for directly viewing a still image or a static image. The driving method for use as a display device for moving image reproduction may be either a simple matrix (passive matrix) method or an active matrix method. Alternatively, by using two or more kinds of the organic EL elements of the present invention having different emission colors, a full-color display device may be manufactured.

[4.2] Photoelectric Conversion Element and Solar Cell

The organic thin film or the organic laminated film of the organic thin film and other organic thin films according to the present invention is preferably applied, for example, as a sealing film of an organic functional layer of a photoelectric conversion element.

Hereinafter, details of the photoelectric conversion element and the solar cell will be described. In the drawing, the organic thin film or the organic multilayer film according to the present invention is omitted, but the entire device is covered with the organic thin film or the organic multilayer film similarly to the organic EL element described above.

Figure 2:
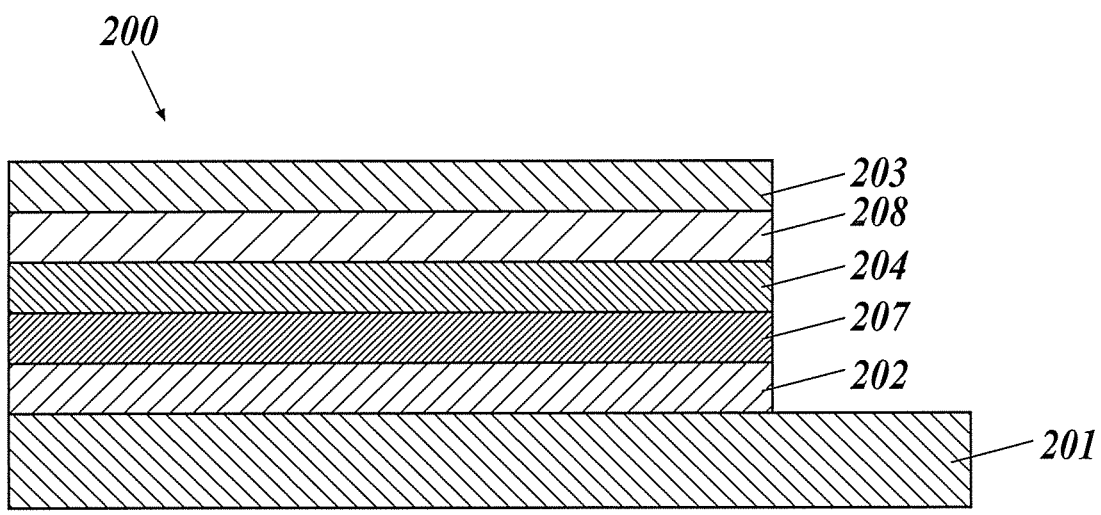
FIG. 2 is a cross-sectional view indicating a solar cell composed of an organic photoelectric conversion element of a bulk heterojunction type.

FIG. 2 is a cross-sectional view indicating an example of a solar cell having a single configuration composed of a bulk heterojunction type organic photoelectric conversion element, in which a bulk heterojunction layer is formed as one layer.

In FIG. 2, in a bulk heterojunction type organic photoelectric conversion element (200), a transparent electrode (anode 202), a hole transport layer (207), a photoelectric conversion unit (204) of a bulk heterojunction layer, an electron transport layer (also referred to as a buffer layer) (208), and a counter electrode (cathode 203) are sequentially stacked on one surface of a substrate (201).

The substrate (201) is a member for holding the transparent electrode (202), the photoelectric conversion portion (204), and the counter electrode (203) which are sequentially stacked. In the present embodiment, since the light to be photoelectrically converted is incident from the substrate (201) side, it is preferable that the substrate (201) is a member capable of transmitting the light to be photoelectrically converted, that is, transparent to the wavelength of the light to be photoelectrically converted. As the substrate 201, for example, a glass substrate or a resin substrate. The substrate (201) is not essential, and for example, the organic photoelectric conversion element (200) of the bulk heterojunction type may be configured by forming the transparent electrode (202) and the counter electrode (203) on both surfaces of the photoelectric conversion unit (204).

The photoelectric conversion unit (204) is a layer for converting light energy into electric energy, and includes a bulk heterojunction layer in which a p-type semiconductor material and an n-type semiconductor material are uniformly mixed. The p-type semiconductor material functions relatively as an electron donor (donor), and the n-type semiconductor material functions relatively as an electron acceptor (acceptor). Here, an electron donor and an electron acceptor are "an electron donor and an electron acceptor in which electrons move from an electron donor to an electron acceptor when light is absorbed to form a pair of holes and electrons (charge separation state)" and donate or accept electrons by a photoreaction rather than simply donating or accepting electrons like an electrode.

In FIG. 2, light incident from the transparent electrode (202) through the substrate (201) is absorbed by an electron acceptor or an electron donor in the bulk heterojunction layer of the photoelectric conversion unit (204), and electrons move from the electron donor to the electron acceptor, thereby forming a pair of holes and electrons (charge separation state). The generated charges are transported to different electrodes by an internal electric field, for example, a potential difference between the transparent electrode (202) and the counter electrode (203) when the work function of the transparent electrode (202) and the counter electrode (203) is different, electrons pass between electron acceptors, holes pass between electron donors, and photocurrents are detected. For example, when the work function of the transparent electrode (202) is larger than the work function of the counter electrode (203), electronics are transported to the transparent electrode (202) and holes are transported to the counter electrode (203). When the magnitude of the work function is reversed, electrons and holes are transported in the opposite direction. In addition, by applying a potential between the transparent electrode (202) and the counter electrode (203), the transport direction of electrons and holes may be controlled.

Although not indicated in FIG. 2, another layer such as a hole blocking layer, an electron blocking layer, an electron injection layer, a hole injection layer, or a smoothing layer may be included.

In addition, for the purpose of further improving the solar light use efficiency (photoelectric conversion efficiency), a tandem type structure (a structure having a plurality of bulk heterojunction layers) in which such photoelectric conversion elements are stacked may be used.

FIG. 3 is a cross-sectional view indicating a solar cell composed of an organic photoelectric conversion element having a tandem bulk heterojunction layer. In the case of the tandem configuration, a transparent electrode (202) and a first photoelectric conversion portion (209) are sequentially stacked on a substrate (201), a charge recombination layer (intermediate electrode 205) is then stacked, and then a second light conversion portion (206) and then a counter electrode (203) are stacked, whereby a tandem structure may be obtained.

Examples of materials that may be used for the above-described layers include n-type semiconductor materials and p-type semiconductor materials described in paragraphs 0045 to 0113 of JP-A No. 2015-149483.

(Method for Forming Bulk Heterogeneous Junction Layer)

As a method of forming a bulk heterojunction layer in which an electron acceptor and an electron donor are mixed, an evaporation method or a coating method (including a casting method and a spin coating method) may be exemplified. Among them, a coating method is preferable in order to increase the area of the interface between holes and electronics for charge separation and to manufacture an element having high photoelectric conversion efficiency. The coating method is also excellent in production speed.

In the present invention, the n-type semiconductor material and the p-type semiconductor material constituting the bulk heterojunction layer may be used as the organic material for an electronic device of the present invention. That is, the bulk heterojunction layer is preferably formed by coating a solution containing the n-type semiconductor material and the p-type semiconductor material, the organic solvent, and the cellulose nanofiber. In the coating liquid containing the n-type semiconductor material and the p-type semiconductor material, the organic solvent, and the cellulose nanofiber, the dissolved carbon dioxide concentration in the organic solvent under the atmospheric pressure condition at 50° C. or less is preferably 1 ppm to the saturation concentration in the organic solvent.

As a means for setting the dissolved carbon dioxide concentration in the above range, as described above, a method of bubbling carbon dioxide gas into a solution containing an n-type semiconductor material and a p-type semiconductor material, an organic solvent, and a cellulose nanofiber, or a supercritical chromatography method using a supercritical fluid containing an organic solvent and carbon dioxide may be cited.

After the coating, heating is preferably performed in order to remove residual solvent, moisture, gas, and cause improvement in mobility and absorption long wave by crystallization of the semiconductor material. When annealing is performed at a predetermined temperature during the manufacturing process, alignment or crystallization is promoted in a portion in a microscopic manner, so that the bulk heterojunction layer may be formed into a suitable phase separation structure. As a result, the carrier mobility of the bulk heterojunction layer is improved, and high efficiency may be obtained.

The photoelectric conversion unit (bulk heterojunction layer) 204 may be formed of a single layer in which an electron acceptor and an electron donor are uniformly mixed, or may be formed of a plurality of layers in which a mixing ratio of the electron acceptor and the electron donor is changed.

Next, electrodes constituting the organic photoelectric conversion element will be described.

In the organic photoelectric conversion element, the positive charge and the negative charge generated in the bulk heterojunction layer are taken out from the transparent electrode and the counter electrode through the p-type organic semiconductor material and the n-type organic semiconductor material, respectively, and function as a battery. Each electrode is required to have characteristics suitable for carriers passing through the electrode.

(Counter Electrode)

In the present invention, the counter electrode (cathode) is preferably an electrode from which electrons are extracted. For example, in the case of use as a cathode, a single layer of a conductive material may be used, but a resin holding these materials may be used in combination with a material having conductivity.

The counter electrode material is required to have sufficient conductivity, to have a work function close to that of not forming a Schottky barrier when bonded to the n-type semiconductor material, and not to deteriorate. That is, metals having a work function of 0 to 0.3 eV higher than that of LUMO of n-type semiconducting materials used in the bulk heterojunction layers are preferable, and 4.0 to 5.1 eV are preferable. On the other hand, since it is not preferable that the work function is deeper than that of the transparent electrode (anode) from which holes are extracted, and interlayer resistance may occur in a metal having a work function shallower than that of the n-type semiconductor material, it is actually preferable that the metal has a work function of 4.2 to 4.8 eV. Therefore, aluminum, gold, silver, copper, indium, or oxide-based materials such as zinc oxide, ITO, and titanium oxide are also preferable. Aluminum, silver, copper, and silver are more preferable.

The work function of these metals may also be measured using ultraviolet photoelectron spectroscopy (UPS).

Alloys may be used as required, and for example, magnesium/silver mixtures, magnesium/aluminum mixtures, magnesium/indium mixtures, aluminum/aluminum oxide ($Al_2O_3$) mixtures, lithium/aluminum mixtures, and aluminum, and are suitable. The counter electrode may be manufactured by forming a thin film of these electrode materials by a method such as evaporation or sputtering. The film thickness is usually selected in the range of 10 nm to 5 μm, preferably 50 to 200 nm.

Further, when the opposite electrode side is made light transmissive, for example, a light transmissive opposite electrode may be obtained by manufacturing a conductive material suitable for the opposite electrode, such as aluminum and aluminum alloy, silver, or a silver compound, in a thin film thickness of about 1 to 20 nm, and then providing a film of a conductive light transmissive material.

(Transparent Electrode)

In the present invention, the transparent electrode is preferably an electrode from which holes are extracted. For example, when the electrode is used as an anode, it is preferably an electrode which transmits light of 380 to 800 nm. As the material, for example, a transparent conductive metal oxide such as indium-tin oxide (ITO), $SnO_2$ or ZnO, a metal thin film such as gold, silver or platinum, a metal nanowire, or a carbon nanotube may be used.

Further, polypyrrole, polyaniline, polythiophene, polythiophene, polyethylene vinylene, polyazulene, polyisothianaphthene, polycarbazole, polyacetylene, polyphenylene, polyphenylene vinylene, polyacetylene, conductive polymer or the like selected from the group consisting of each derivative of polydiacetylene and polynaphthalene may also be used. In addition, a transparent electrode may be formed by combining a plurality of these conductive compounds.

(Intermediate Electrode)

As a material of the intermediate electrode required for the tandem configuration, a layer using a compound having both transparency and conductivity is preferable, and a material used for the transparent electrode (a transparent metal oxide such as ITO, AZO, FTO, titanium oxide, a very thin metal layer such as Ag, Al, Au, or the like, a layer containing nanoparticles and nanowires, a conductive polymer material such as PEDOT:PSS, or polyaniline may be used.

Note that the above-mentioned hole transport layer and electron transport layer may be combined to function as an intermediate electrode (charge recombination layer) by appropriately combining and stacking them, and in such a configuration, it is possible to omit the step of forming one layer.

Next, the material constituting other than the electrode and the bulk heterojunction layer will be described.

(Hole Transport Layer and Electron Blocking Layer)

Since the organic photoelectric conversion element enables more efficient extraction of charges generated in the bulk heterojunction layer, it is preferable that the bulk heterojunction layer and the transparent electrode have a hole transport layer and an electron blocking layer between them.

As a material constituting these layers, for example, as the hole transporting layer, PEDOT such as Clevious manufactured by Heraeus Inc., polyaniline and its doping material, a cyanide compound described in WO2006/019270 may be used.

Note that the hole transporting layer having a LUMO level shallower than LUMO level of the n-type semiconducting materials used in the bulk heterojunction layer is given an electronic blocking function having a rectifying effect such that electrons generated in the bulk heterojunction layer do not flow to the transparent electrodes. Such a hole transport layer is also called an electron blocking layer, and it is preferable to use a hole transport layer having such a function. As such a material, it is possible to use a triarylamine-based compound described in JP-A 5-271166, also molybdenum oxide, nickel oxide, a metal oxide such as tungsten oxide. Alternatively, a layer composed of a p-type semiconductor material alone used for the bulk heterojunction layer may be used. The means for forming these layers may be either a vacuum deposition method or a solution coating method, but it is preferably a solution coating method. It is preferable to form the coating film on the lower layer before forming the bulk heterojunction layer because it has the effect of leveling the coating surface and reduces the influence of leakage.

(Electron Transport Layer, Hole Blocking Layer, and Buffer Layer)

The organic photoelectric conversion element preferably has an electron transport layer, a hole blocking layer, and a buffer layer formed between the bulk heterojunction layer and the counter electrode, so that charges generated in the bulk heterojunction layer may be extracted more efficiently.

As the electron transport layer, octaazaporphyrin or a perfluoro compound of a p-type semiconductor (perfluoropentacene or perfluorophthalocyanine) may be used, but similarly, the electron transport layer having a HOMO level deeper than HOMO level of the p-type semiconductor material used for the bulk heterojunction layer is provided with a hole blocking function having a rectifying effect such that holes generated in the bulk heterojunction layer do not flow to the opposite electrode side. Such an electron transport layer is also called a hole blocking layer, and it is preferable to use an electron transport layer having such a function. As such a material, a phenanthrene-based compound such as vasocuproine, an n-type semiconductor material such as naphthalenetetracarboxylic anhydride, naphthalenetetracarboxylic acid diimide, perylenetetracarboxylic anhydride, or perylenetetracarboxylic acid diimide, an n-type inorganic oxide such as titanium oxide, zinc oxide, or gallium oxide, or a layer composed of a simple n-type semiconductor material used for a bulk heterojunction layer may be used.

Alternatively, an alkali metal compound such as lithium fluoride, sodium fluoride, or cesium fluoride may be used.

Among these, it is preferable to use an alkali metal compound which further has a function of doping an organic semiconductor molecule and improving electrical bonding with the metal electrode. In the case of an alkali metal compound layer, it may be referred to as a buffer layer in particular.

(Other Layer)

In order to improve the energy conversion efficiency and the device lifetime, various intermediate layers may be provided in the device. Examples of the intermediate layer include a hole blocking layer, an electron blocking layer, a hole injection layer, an electron injection layer, an exciton blocking layer, a UV absorbing layer, a light reflecting layer, and a wavelength conversion layer.

(Substrate)

When light to be photoelectrically converted is incident from the substrate side, it is preferable that the substrate be a member capable of transmitting the light to be photoelectrically converted, that is, transparent to the wavelength of the light to be photoelectrically converted. As the substrate, for example, a glass substrate or a resin substrate is suitably given, but it is desirable to use a transparent resin film from the viewpoint of lightness and flexibility.

There is no particular limitation on the transparent resin film which is preferably used as a transparent substrate in the present invention, and the material, shape, structure, and thickness thereof may be appropriately selected from known ones. For example, a resin film having a transmittance of 80 nm or more at a wavelength of 800 nm is particularly preferable as long as it is a polyester resin film such as polyethylene terephthalate (PET), polyethylene naphthalate (PEN), or modified polyester, a polyethylene (PE) resin film, a polypropylene (PP) resin film, a polystyrene resin film, a polyolefin resin film such as a cyclic olefin resin film, a vinyl resin film such as polyvinyl chloride or polyvinylidene chloride, a vinyl resin film such as polyphenylene ether ketone (PEEK) resin film, a polysulfone (PSF) resin film, a polyether sulfone (PES) resin film, a polycarbonate (PC) resin film, a polyamide resin film, a polyimide resin film, an acrylic resin film, or a triacetyl cellulose resin film. Among them, from the viewpoints of transparency, heat resistance, ease of handling, strength and cost, biaxially oriented polyethylene terephthalate film, biaxially oriented polyethylene naphthalate film, polyether sulfone film and polycarbonate film are preferable, and biaxially oriented polyethylene terephthalate film and biaxially oriented polyethylene naphthalate film are more preferable.

The transparent substrate used in the present invention may be provided with a surface treatment or an easy adhesive layer in order to secure wettability and adhesiveness of the coating liquid. Conventional known techniques may be used for the surface treatment and the easy adhesive layer. For example, the surface treatment may include surface activation treatment such as corona discharge treatment, flame treatment, ultraviolet treatment, high-frequency treatment, glow discharge treatment, active plasma treatment, and laser treatment. Examples of the easy adhesive layer include layers made of polyester, polyamide, polyurethane, vinyl copolymer, butadiene copolymer, acrylic copolymer, vinylidene copolymer, and epoxy copolymer.

In addition, for the purpose of suppressing the transmission of oxygen and water vapor, a barrier coat layer may be formed in advance on the transparent substrate.

(Optical Function Layer)

The organic photoelectric conversion element may have various optical functional layers for the purpose of more efficient reception of sunlight. As the optical function layer, for example, the following layers may be provided: an anti-reflection film, a light collecting layer such as a microlens array, and a light diffusion layer so that light reflected at the counter electrode may be scattered and made incident on the bulk heterojunction layer again.

As the anti-reflection layer, various known anti-reflection layers may be provided, and for example, when the transparent resin film is a biaxially oriented polyethylene terephthalate film, it is more preferable to set the refractive index of the easy adhesive layer adjacent to the film to 1.57 to 1.63 because the interface reflection between the film substrate and the easy adhesive layer may be reduced and the transmittance may be improved. As a method of adjusting the refractive index, coating may be performed by appropriately adjusting the ratio of an oxide sol having a relatively high refractive index, such as a tin oxide sol or a cerium oxide sol, to a binder resin. The easy adhesive layer may be a single layer, but may be formed of two or more layers in order to improve the adhesiveness.

As the light collecting layer, for example, by processing to provide a structure on the microlens array on the sunlight receiving side of the support substrate, or by combining with a so-called light collecting sheet, it is possible to increase the amount of light received from a specific direction, and conversely, to reduce the incident angle dependence of sunlight.

As an example of the microlens array, a quadrangular pyramid having a side of 30 μm and a vertex angle of 90 degrees is two-dimensionally arranged on the light extraction side of the substrate. One side length is preferably in the range of 10 to 100 μm. When it is smaller than this value, the diffraction effect is generated and colored, and when it is excessively large, the thickness becomes thick, which is not preferable.

Examples of the light scattering layer include various anti-glare layers, and a layer in which nanoparticles or nanowires of metals or various inorganic oxides are dispersed in a colorless and transparent polymer.

(Patterning)

The method or process of patterning the electrode, the power generation layer, the hole transport layer, and the electron transport layer is not particularly limited, and a known method may be appropriately applied.

When the material is a soluble material such as a bulk heterojunction layer or a transport layer, unnecessary portions may be wiped off after coating the entire surface with a die coating or dip coat coating, or may be directly patterned at the time of coating using a method such as an inkjet printing method or a screen printing method.

In the case of insoluble materials such as electrode materials, the electrodes may be mask deposited during vacuum deposition or patterned by known methods such as etching or lift-off. Alternatively, the pattern may be formed by transferring a pattern formed on another substrate.

(Sealing)

In addition, in order to prevent the manufactured organic photoelectric conversion element from being deteriorated by oxygen and moisture in the environment, it is preferable that sealing is performed by a known method for an organic photoelectric conversion element or an organic EL element other than the organic thin film and the organic laminated film according to the present invention. For example, a method of sealing a cap made of aluminum or glass by adhering it with an adhesive, a method of adhering a plastic film on which a gas barrier layer such as aluminum, silicon oxide, or aluminum oxide is formed and an organic photoelectric conversion element with an adhesive, a method of spin coating an organic polymer material having a high gas barrier property (polyvinyl alcohol or the like), a method of depositing an inorganic thin film having a high gas barrier property (silicon oxide, aluminum oxide, or the like) or an organic film (e.g., parylene) under vacuum, and a method of stacking these may be mentioned.

[4.3] Organic Thin Film Transistor

FIG. 4 is a schematic cross-sectional view indicating the structure of the organic thin film transistor. In the drawing, the organic thin film or the organic multilayer film according to the present invention is omitted, but the entire device is covered with the organic thin film or the organic multilayer film similarly to the organic EL element described above.

FIG. 4A indicates that a source electrode (302) and a drain electrode (303) are formed on a support (306) using a metal foil, and a charge-transporting thin film (organic semiconductor layer 301) composed of 6,13-bistriisopropylsilylethynylpentacene is formed between both electrodes as an organic semiconductor material described in JP-A No. 2009-101852, an insulating layer (305) is formed thereon, and a gate electrode (304) is further formed thereon to form a field effect transistor.

FIG. 4B indicates an organic semiconductor layer (301), which is formed between the electrodes in FIG. 4A, which is formed so as to cover the entire electrode and the support surface using a coating method.

Figure 4C:
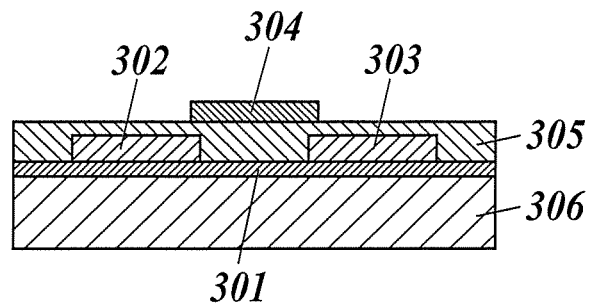
FIG. 4C is a diagram indicating another exemplary configuration of the organic thin film transistor.

FIG. 4C indicates a structure in which an organic semiconductor layer (301) is first formed on a support (306) by a coating method, and then a source electrode (302), a drain electrode (303), an insulating layer (305), and a gate electrode (304) are formed on the organic semiconductor layer (301).

Figure 4D:
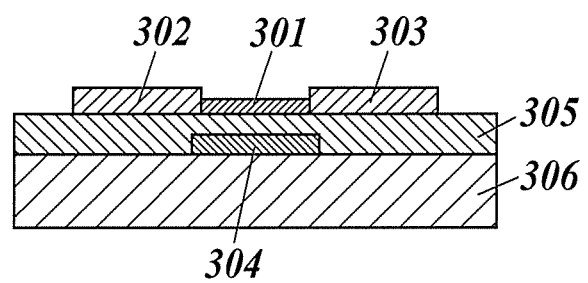
FIG. 4D is a diagram indicating another exemplary configuration of the organic thin film transistor.

In FIG. 4D, after forming the gate electrode (304) on the support (306) with a metal foil, an insulating layer (305) is formed thereon to form a source electrode (302) and a drain electrode (303) with a metal foil, thus, the organic semiconductor layer (301) is formed by a luminescent composition according to the present invention between the electrodes.

Figure 4E:
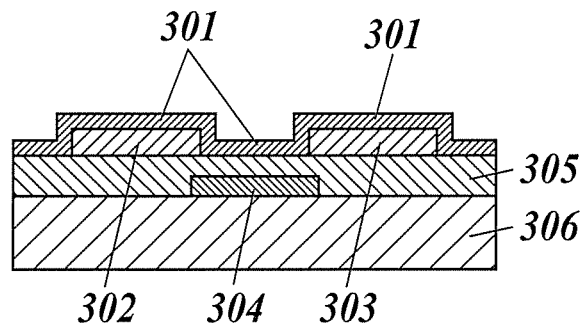
FIG. 4E is a diagram indicating another exemplary configuration of the organic thin film transistor.
Figure 4F:
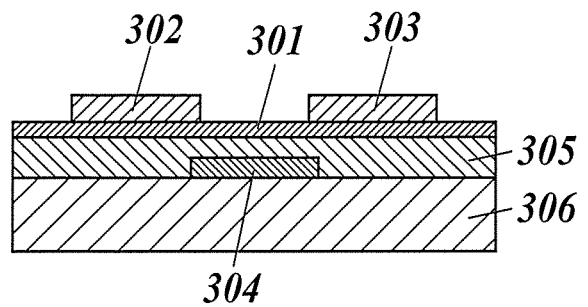
FIG. 4F is a diagram indicating another exemplary configuration of the organic thin film transistor.
Figure 5:
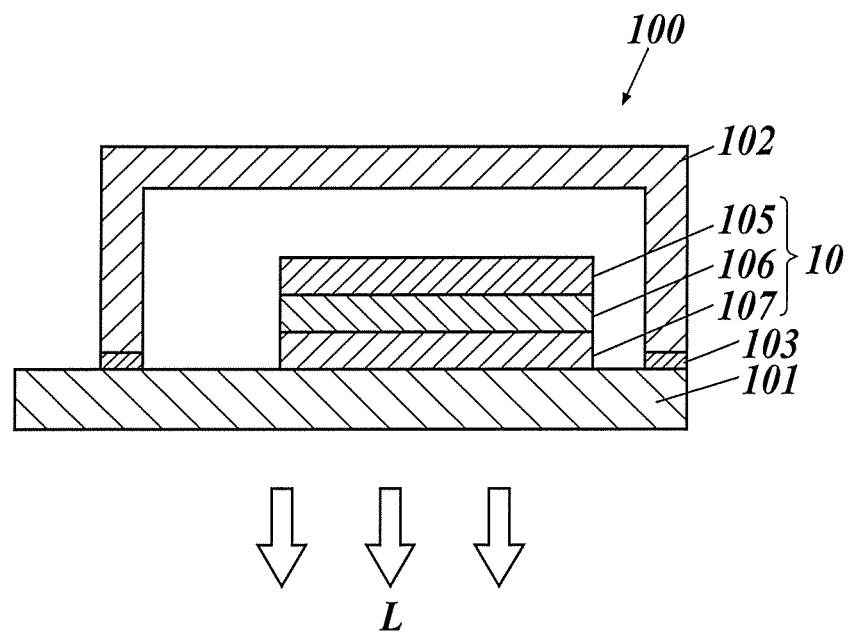
FIG. 5 is a cross-sectional view of an organic EL element used in the embodiment.
Figure 6:
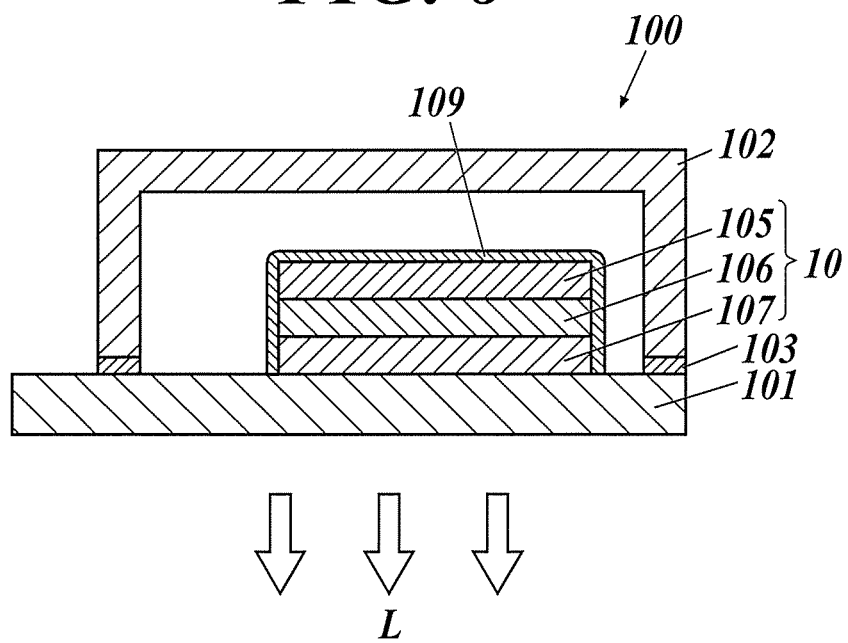
FIG. 6 is a cross-sectional view of an organic EL element used in the embodiment.
Figure 7:
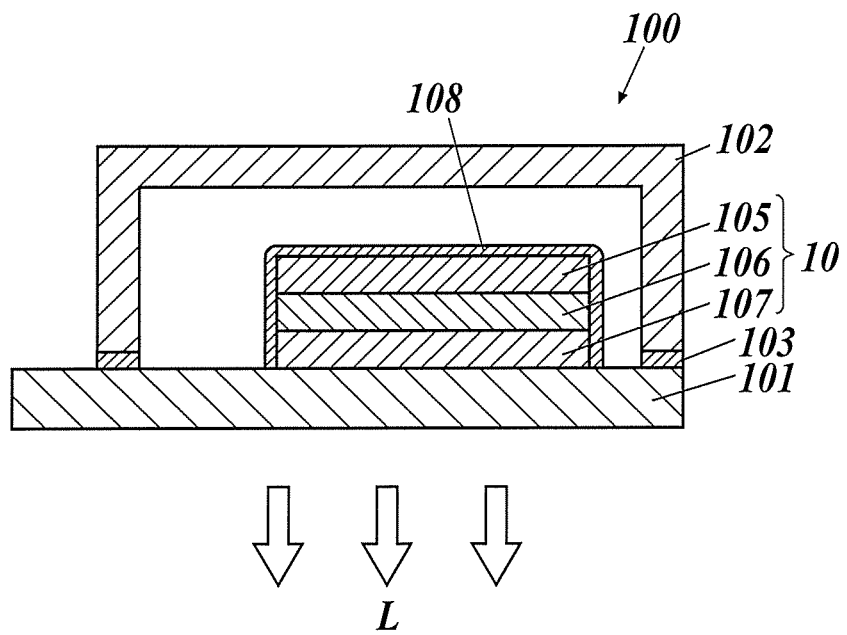
FIG. 7 is a cross-sectional view of an organic EL element used in the embodiment.
Figure 8:
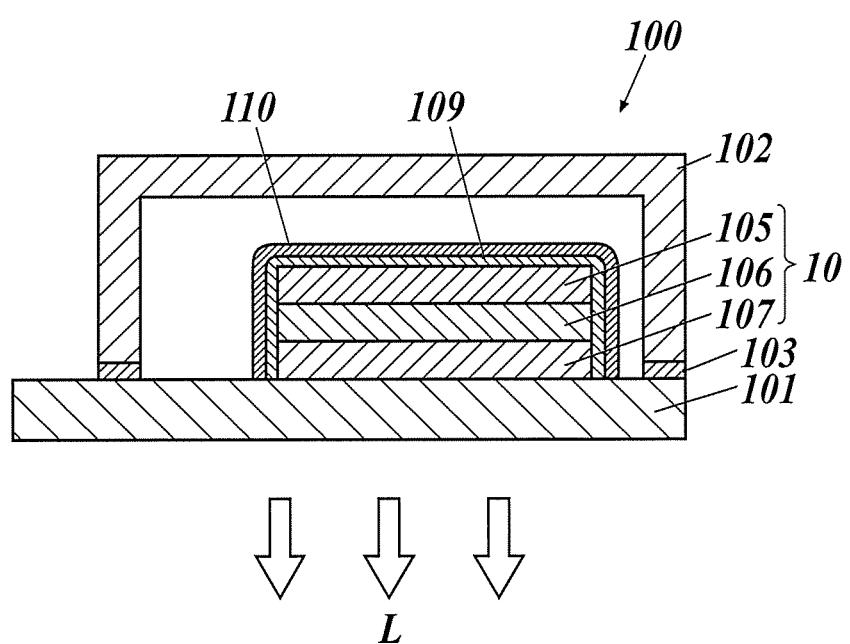
FIG. 8 is a cross-sectional view of an organic EL element used in the embodiment.

In addition, a configuration as indicated in FIG. 4E and FIG. 4F may be adopted.

EXAMPLES

Hereinafter, the present invention will be described in detail with reference to examples, but the present invention is not limited thereto. In the examples, "parts" or '%' is used, but unless otherwise specified, it indicates "parts by mass" or "% by mass".

Example 1

(Preparation of Organic EL Element)

A glass substrate on which a 100 nm-thick film of ITO (Indium Tin Oxide) was formed as an anode was subjected to ultrasonic cleaning with isopropyl alcohol, dried with dry nitrogen gas and UV-ozone cleaning, and fixed to a substrate holder of a vacuum evaporation device.

Then, HAT-CN (1,4,5,8,9,12-hexaazatriphenylene hexacarbonitrile) was evaporated to a thickness of 10 nm to provide hole injection-transport layer.

Next, α-NPD (4,4'-bis[N-(1-naphthyl)-N-phenylamino] biphenyl) was vapor-deposited on the hole injection layer to provide a hole transport layer having a thickness of 40 nm.

Then, mCP (1,3-bis(N-carbazolyl)benzene) as a host material and bis[2-(4,6-difluorophenyl)pyridinato-C2,N)(picolinato)iridium(III)(FIrpic) as a light-emitting compound were co-evaporated to be 94% and 6% by volume, respectively, to provide a 30 nm-thick light-emitting layer.

Thereafter, BCP (2,9-dimethyl-4,7-diphenyl-1,10-phenanthroline) was vapor-deposited to provide an electron transport layer with a thickness of 330 nm.

Further, 100 nm-thick silver was further vapor-deposited to provide a cathode.

(Preparation of Sealing Film 1)

A solution of titanium tetraisopropoxide (Ti(OiPr)$_4$) in 3% by mass in dehydrated tetrafluoropropanol (exemplified compound F-1) was prepared in a glove box under a dry nitrogen atmosphere having a water content of 1 ppm or less, and the solution was opened to the atmosphere having a humidity of 30% for 1 minute, and immediately returned to the inside of the glove box as a sol-gel solution.

An organic multilayer film composed of a sol-gel solution and an elution preventing film was coated and formed on the cathode of the organic EL element under the conditions indicated in Table I below.

The organic multilayer film refers to a multilayer film in which a coating solution containing polydimethylsiloxane (PDMS) is first coated and deposited on the negative electrode to a thickness of 250 nm, UV irradiation is performed for one minute, and then VUV irradiation is performed for one minute, and then the sol-gel solution is further coated on a film containing PDMS to a thickness of 100 nm, and a film is formed by UV, VUV, or heat, and organic thin films are stacked.

Next, the following gas barrier film was produced as a sealing member of the entire organic EL element.

An inorganic gas barrier layer made of SiO$_x$ was formed on the entire surface of a polyethylene naphthalate film (manufactured by Teijin Film Solution Co., Ltd.) to a thickness of 500 nm by using an atmospheric pressure plasma-discharge treatment device having a configuration described in JP-A No. 2004-68143. Thus, a flexible gas barrier film having a gas barrier property with an oxygen permeability of 0.001 mL/(m$^2$·24h·atm) or less and a water vapor permeability of 0.001 g/(m$^2$·24h) or less was produced. On one surface of the gas barrier film, a thermosetting liquid adhesive (epoxy resin) was formed to a thickness of 25 μm as a sealing resin layer. Then, the gas barrier film provided with the sealing resin layer was superimposed on the element formed by coating the sol-gel solution. At this time, the surface of the gas barrier film on which the sealing resin layer was formed was continuously superimposed on the sealing surface side of the organic EL element so that the ends of the extraction portions of the anode and the cathode were exposed to the outside.

Next, the sample to which the gas barrier film was attached was placed in a decompression device, and held for 5 minutes by pressing under a decompression condition of 0.01 MPa at 90° C. The sample was then returned to atmospheric pressure and heated at 90° C. for 30 minutes to cure the adhesive.

The above sealing step was performed under atmospheric pressure, under a nitrogen atmosphere having a moisture content of 1 ppm or less, in accordance with JIS B 9920, at a Class 100 cleanliness, a dew point temperature of −80° C. or less, and an atmospheric pressure at an oxygen concentration of 0.8 ppm or less. The sealing film 1 in which the organic EL element was sealed was manufactured by the above method. A cross-sectional view of the organic EL element is indicated in FIG. 1.

(Preparation of Sealing Films 2 to 26)

The sealing films 2 to 26 were produced in the same manner as the sealing film 1 except that the presence or absence of the elution preventing film, the type of raw material of the sol-gel solution, the film forming conditions, and the organic EL element configuration were changed as indicated in Table I. Cross-sectional views of the organic EL element are shown in FIGS. 1, and 5 to 9.

The compound of the comparative example used in the sealing film 25 was a compound having a structure represented by the chemical formula (1) described in JP-A No. 2005-000792, and a compound having the following structure was used.

(Comparative compound)

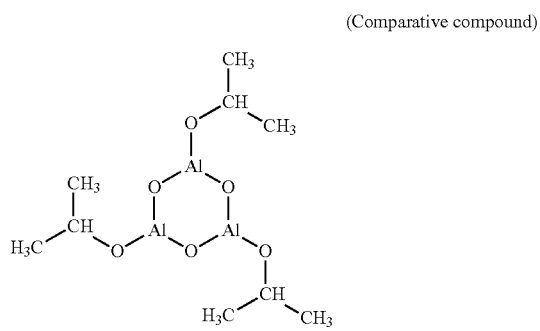

Heating was performed using a hot plate in a glove box. The UV-irradiation was performed by irradiating a low-pressure mercury lamp in a glove box at an intensity of 37 mW/cm$^2$. The VUV-irradiation was performed by irradiating xenon excimer light in a glove box at an intensity of 65 mW/cm$^2$.

<Evaluation>

The luminescence state after leaving at 60° C. and 90% RH for one week was observed, and the sealing performance was evaluated. Specifically, a 100-fold optical microscope (MS-804 manufactured by Moritex Corporation, a lens MP-ZE25-200) was photographed by enlarging a portion of the light-emitting portion of the organic EL element. Next, the photographed image was cut out in 2 mm squares, and the presence or absence of dark spot generation was observed for each image. The ratio of the area of dark spots generated to the area of light emission was determined from the observation results, and the dark spot resistance was evaluated according to the following criteria.

5: There is no occurrence of dark spots.

4: The area of dark spot generation is 0.1% or more and less than 1.0%.

3: The area of dark spot generation is 1.0% or more and less than 3.0%.

2: The area of dark spot generation is 3.0% or more and less than 6.0%.

1: The area of dark spot generation is 6.0% or more.

The composition and evaluation results of the sealing film are shown in Table I below.

TABLE I

| Sealing film No. | Elution preventing film | Organic thin film (Sealing film: Sol-gel liquid composition) | | | Cross-sectional view of Organic EL element | Dark spot resistance | Remarks |
| | | Metal alkoxide | Alcohol | Film forming condition | | | |
|---|---|---|---|---|---|---|---|
| Sealing film 1 | Present | Ti(OiPr)$_4$ | F-1 | VUV irradiation for 1 minute | FIG. 1 | 4 | Present invention |
| Sealing film 2 | Present | Ti(OiPr)$_4$ | F-1 | UV irradiation for 30 minutes | FIG. 1 | 4 | Present invention |
| Sealing film 3 | Present | Ti(OiPr)$_4$ | F-1 | Heating at 100° C. for 30 minutes | FIG. 1 | 3 | Present invention |
| Sealing film 4 | Present | Ti(OiPr)$_4$ | F-1 | VUV irradiation for 1 minute | FIG. 1 | 5 | Present invention |
| | | Ti(OiPr)$_4$ | F-1 | 3 times coating of sol-gel liquid | | | |
| Sealing film 5 | Present | Ti(OiPr)$_4$ | F-2 | VUV irradiation for 1 minute | FIG. 1 | 4 | Present invention |
| Sealing film 6 | Present | Ti(OiPr)$_4$ | F-5 | VUV irradiation for 1 minute | FIG. 1 | 4 | Present invention |
| Sealing film 7 | Present | Ti(OiPr)$_4$ | F-6 | VUV irradiation for 1 minute | FIG. 1 | 3 | Present invention |
| Sealing film 8 | Present | Ti(OiPr)$_4$ | F-3 | VUV irradiation for 1 minute | FIG. 1 | 4 | Present invention |
| Sealing film 9 | Present | Ti(OiPr)$_4$ | F-4 | VUV irradiation for 1 minute | FIG. 1 | 4 | Present invention |
| Sealing film 10 | Present | Ti(OiPr)$_4$ | F-7 | VUV irradiation for 1 minute | FIG. 1 | 3 | Present invention |
| Sealing film 11 | Present | Ti(OiPr)$_4$ | F-8 | VUV irradiation for 1 minute | FIG. 1 | 3 | Present invention |
| Sealing film 2 | Present | Ti(OiPr)$_4$ | F-9 | VUV irradiation for 1 minute | FIG. 1 | 4 | Present invention |
| Sealing film 13 | Present | Ti(OiPr)$_4$ | F-10 | VUV irradiation for 1 minute | FIG. 1 | 4 | Present invention |
| Sealing film 14 | Present | Ti(OiPr)$_4$ | F-11 | VUV irradiation for 1 minute | FIG. 1 | 4 | Present invention |
| Sealing film 15 | Present | Ti(OiPr)$_4$ | F-12 | VUV irradiation for 1 minute | FIG. 1 | 3 | Present invention |
| Sealing film 16 | Present | Ti(OiPr)$_4$ | F-13 | VUV irradiation for 1 minute | FIG. 1 | 4 | Present invention |

TABLE I-continued

| Sealing film No. | Elution preventing film | Organic thin film (Sealing film: Sol-gel liquid composition) | | | Cross-sectional view of Organic EL element | Dark spot resistance | Remarks |
|---|---|---|---|---|---|---|---|
| | | Metal alkoxide | Alcohol | Film forming condition | | | |
| Sealing film 17 | Present | Ti(OiPr)$_4$ | F-14 | VUV irradiation for 1 minute | FIG. 1 | 4 | Present invention |
| Sealing film 18 | Present | Ti(OiPr)$_4$ | F-15 | VUV irradiation for 1 minute | FIG. 1 | 3 | Present invention |
| Sealing film 19 | Present | Ti(OiPr)$_4$ | F-16 | VUV irradiation for 1 minute | FIG. 1 | 4 | Present invention |
| Sealing film 20 | Absent | Ti(OiPr)$_4$ | F-1 | VUV irradiation for 1 minute | FIG. 7 | 3 | Present invention |
| Sealing film 21 | | Only gas barrier film is used | | | FIG. 5 | 1 | Comparative example |
| Sealing film 22 | Present | Absent | | | FIG. 6 | 1 | Comparative example |
| Sealing film 23 | Present | Ti(OiPr)$_4$ | 2-Methoxyethanol | VUV irradiation for 1 minute | FIG. 8 | 2 | Comparative example |
| Sealing film 24 | Present | Ti(OiPr)$_4$ | N-butanol | VUV irradiation for 1 minute | FIG. 8 | 2 | Comparative example |
| Sealing film 25 | Present | Desiccant having a chemical structure (Chem. 1) in JP-A 2005-000792 | — | | FIG. 8 | 2 | Comparative example |
| Sealing film 26 | Present | CaO | | — | FIG. 9 | 2 | Comparative example |

From the above evaluation results, it was confirmed that high sealing performance was obtained by the sealing film formed by coating according to the present invention.

Example 2

Using the same constitution as that of the sealing film 1 of Example 1, the metal alkoxide and the metal carboxylate raw material used for the sealing film were changed as indicated in Table II, and the sealing performance was evaluated.

The composition and evaluation results of the sealing film are indicated in Table II.

From the above evaluation results, it was confirmed that even when the metal alkoxide and the metal carboxylate raw material according to the present invention were changed, high sealing performance was obtained in the same manner as in Example 1.

Example 3

The sol-gel solution used in Example 1 was applied onto a silicon wafer, and a thin film was produced under the same film forming conditions as in Example 1. The prepared thin film was analyzed by the above-mentioned SEM/EDS (Energy Dispersive X-ray Spectoroscopy: energy-dispersive X-ray analyzer) to obtain the values of the following expression (a). SEM/EDS equipment was made by JSM-IT100 (JEOL Ltd).

TABLE II

| Sealing film No. | Elution preventing film | Organic thin film (Sealing film: Sol-gel liquid composition) | | | *1 | Dark spot resistance | Remarks |
|---|---|---|---|---|---|---|---|
| | | Metal alkoxide | Alcohol | Film forming condition | | | |
| Sealing film 2-1 | Present | Ti(OiPr)$_4$ | F-1 | VUV irradiation for 1 minute | FIG. 1 | 4 | Present invention |
| Sealing film 2-2 | Present | Ti(OEt)$_4$ | F-1 | VUV irradiation for 1 minute | FIG. 1 | 4 | Present invention |
| Sealing film 2-3 | Present | Zr(OiPr)$_4$ | F-1 | VUV irradiation for 1 minute | FIG. 1 | 4 | Present invention |
| Sealing film 2-4 | Present | Sn(OtBu)$_4$ | F-1 | VUV irradiation for 1 minute | FIG. 1 | 3 | Present invention |
| Sealing film 2-5 | Present | Ta(OtBu)$_5$ | F-1 | VUV irradiation for 1 minute | FIG. 1 | 4 | Present invention |
| Sealing film 2-6 | Present | Fe(OCOCH$_3$)$_2$ | F-1 | VUV irradiation for 1 minute | FIG. 1 | 3 | Present invention |
| Sealing film 2-7 | Present | Zn(OCOCH$_3$)$_2$·2H$_2$O | F-1 | VUV irradiation for 1 minute | FIG. 1 | 4 | Present invention |
| Sealing film 2-8 | | Only gas barrier film is used | | | FIG. 5 | 1 | Comparative example |

*1: Cross-sectional view of Organic EL element

Elemental analysis by SEM/EDS (energy dispersive X-ray spectrometer) and the values obtained by the following expression (a) are indicated in Table III.

$$F/(C+F)$$ Expression (a):

(In Expression (a), F and C represent the concentrations of fluorine and carbon atoms, respectively.)

TABLE III

| Sol-gel liquid composition | | |
| --- | --- | --- |
| Metal alkoxide | Metal alkoxide | F/(C + F) |
| Ti (OiPr)$_4$ | F-1 | 0.20 |
| Ti (OiPr)$_4$ | F-2 | 0.33 |
| Ti (OiPr)$_4$ | F-5 | 0.42 |
| Ti (OiPr)$_4$ | F-6 | 0.19 |

From the results in Table III, it was confirmed that the thin film prepared from the sol-gel solution of Example 1 retained fluorine atoms in the film at a certain ratio.

Example 4

Next, in Example 4, the sealing property of a lighting device (and an element) emitting blue fluorescence, which was manufactured by the inkjet printing method, was confirmed.

<Preparation of Lighting Device for Evaluation>
(Preparation of Substrate)

First, on the entire surface of a polyethylene naphthalate film (manufactured by Teijin Film Solution Co., Ltd.) on which an anode was formed, an inorganic gas barrier layer made of SiO$_x$ was formed to a thickness of 500 nm by using an atmospheric pressure plasma-discharge treatment device having a structure described in JP-A No. 2004-68143. Thus, a flexible base material having a gas barrier property with an oxygen permeability of 0.001 mL/(m$^2$·24h·atm) or less and a water vapor permeability of 0.001 g/(m$^2$·24h) or less was produced.

(Formation of Anode)

An ITO (indium tin oxide) film having a thickness of 120 nm was formed on the above-mentioned base material by a sputtering method, and was patterned by a photolithography method to form an anode. The pattern was such that the area of the light-emitting region was 5 cm×5 cm.

(Formation of Hole Injection Layer)

The substrate on which the anode was formed was ultrasonically cleaned with isopropyl alcohol, dried with dry nitrogen gas, and subjected to UV ozone cleaning for 5 minutes. Then, on the substrate on which the anode was formed, a 2% by mass solution obtained by diluting a poly(3,4-ethylenedioxythiophene)/polystyrene sulfonate (PEDOT/PSS) dispersion prepared in the same manner as in Example 16 of Japanese Patent No. 4509787 was applied by an inkjet printing method, and dried at 80° C. for 5 minutes to form a hole injecting layer having a layer thickness of 40 nm.

(Formation of Hole Transport Layer)

Next, the base material on which the hole injection layer was formed was transferred to a nitrogen atmosphere using a nitrogen gas (grade G1), applied by an inkjet printing method using a coating solution for forming a hole transport layer having the following composition, and dried at 150° C. for 30 minutes to form a hole transport layer having a layer thickness of 30 mm <Coating Solution for Forming Hole Transport Layer>
Hole transport material HT-3 (weight-average molecular weight Mw=80000): 10 parts by mass
(p)-Xylene: 3000 parts by mass (Formation of Light-Emitting Layer)

Next, the base material on which the hole transport layer was formed was coated by an inkjet method using a coating solution for forming a light-emitting layer having the following composition, and dried at 130° C. for 30 minutes to form a light-emitting layer having a layer thickness of 50 nm.

<Coating Solution for Forming Light-Emitting Layer>
Host compound H-4: 9 parts by mass
Metal complex CD-2: 1 part by mass
Fluorescent materials F-1: 0.1 parts by mass
Normal butyl acetate: 2,000 parts by mass (Formation of Blocking Layer)

Next, the base material on which the light-emitting layer was formed was coated by an inkjet method using a coating solution for forming a blocking layer having the following composition, and dried at 80° C. for 30 minutes to form a blocking layer having a layer thickness of 10 nm.

<Coating Solution for Forming Blocking Layer>
HB-4: 2 parts by mass
Isopropyl alcohol (IPA): 1500 parts by mass
2,2,3,3,4,4,5,5-Octafluoro-1-pentanol: 500 parts by mass (Formation of Electron Transport Layer)

Next, the base material on which the blocking layer was formed was coated by an inkjet printing method using a coating solution for forming an electron transport layer having the following composition, and dried at 80° C. for 30 minutes to form an electron transport layer having a layer thickness of 30 mm <Coating Solution for Forming Electron Transport Layer>
ET-1: 6 parts by mass
2,2,3,3-tetrafluoro-1-propanol: 2000 parts by mass (Formation of Electron Injection Layer and Cathode)

The substrate was then attached to a vacuum deposition apparatus without exposure to the atmosphere. A resistance heating boat made of molybdenum containing sodium fluoride and potassium fluoride was attached to a vacuum evaporation apparatus, and the vacuum chamber was depressurized to 4×10$^{-5}$ Pa. Thereafter, the boat was energized and heated to deposit sodium fluoride at 0.02 nm/sec on the electron transport layer to form a thin film having a thickness of 1 mm. Similarly, potassium fluoride was vapor-deposited on the sodium fluoride thin film at 0.02 nm/sec to form an electron injection layer having a thickness of 1.5 nm.

Subsequently, aluminum was vapor-deposited to form a cathode having a thickness of 100 nm.

Thereafter, in the same manner as in Example 1, a sealing film using an elution preventing film and a sol-gel liquid (conditions used for the sealing film 1) was produced on the cathode by an inkjet printing method, and thereafter, the gas barrier film described in Example 1 was bonded to produce an organic EL element using an inkjet printing method. The compounds used are indicated below.

-continued

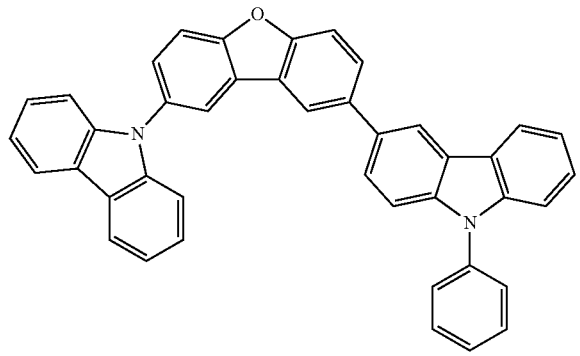

H-4

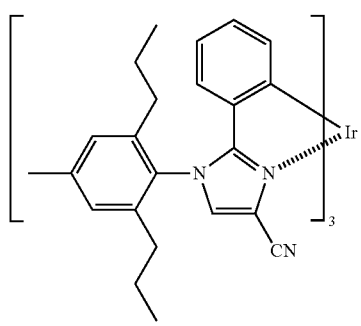

CD-2

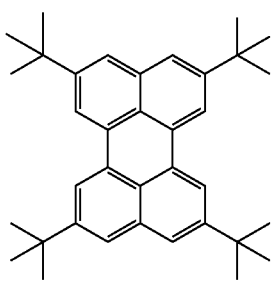

F-1

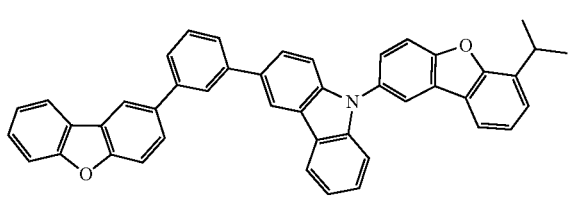

HB-4

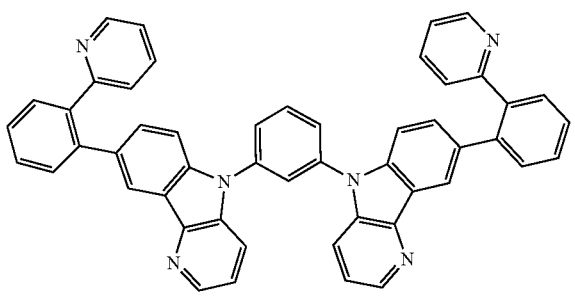

ET-1

<Evaluation>

The organic EL element having the sealing film 1 was improved in dark spot resistance in a state of being left at 60° C. and 90% RH for one week in the same manner as in Example 1, as compared with the organic EL element having no sealing film formed by the sol-gel solution (the sealing film 21 and the sealing film 22 in Example 1). From the above, it was confirmed that, even in the lighting device manufactured by the inkjet printing method, a high sealing performance is obtained by the sealing film formed by coating and deposition according to the present invention.

Example 5

A sol-gel solution of Example 1 (conditions used for the sealing film 1) was applied and deposited on a silicon wafer, and the contact angle of pure water before and after the obtained organic thin film being left to stand at 60° C. and 90% RH for 1 hour was measured by the following solution method. As a result, the contact angle with pure water was 40° before leaving, whereas after leaving, the contact angle increased to 60°. From the above results, it was recognized that the organic thin film prepared from the sol-gel liquid released a hydrophobic (water-repellent) substance when it came into contact with moisture, and the hydrophobicity (water repellency) of the surface was enhanced by the orientation of the film on the film surface.

<Measurement of Contact Angle>

The contact angle of pure water on the surface of the organic thin films was measured by dropping 1 μL of pure water to the samples of the organic thin films before and after being left at 60° C. and 90% RH for 1 hour on the basis of JIS-R3257 in an atmosphere of 23° C. and 55% RH using a contact angle meter (manufactured by Kyowa Interface Scientific Co., Ltd., product name DropMaster DM100), and measuring the contact angle after 1 minute. In the measurement, 10 points were measured at equal intervals in the width direction of the organic thin film, and the average value was set as the contact angle except for the maximum value and the minimum value.

Example 6

An organic thin film solar cell (organic photoelectric conversion element) was manufactured by using a sealing film formed by coating according to the present invention.

<Preparation of Organic Photoelectric Conversion Element>

A glass substrate on which a 100 nm-thick film of ITO (Indium Tin Oxide) was formed as an anode was subjected to ultrasonic cleaning with isopropyl alcohol, dried with dry nitrogen gas and UV-ozone cleaning, and fixed to a substrate holder of a vacuum evaporation device.

After the degree of vacuum in the vacuum evaporation device was reduced to $1 \times 10^{-4}$ Pa, copper phthalocyanine (CuPC) and anthra[9,1,2-c,d,e:10,5,6-c',d',e'][bis[benzimidazolo[2,1-a]isoquinoline]]-10,21-dione (PTCBI) were co-evaporated at a ratio of CuCP:PTCBI=1:1 on the anode, and a bulk heterojunction layer was formed at a thickness of 400 nm.

Subsequently, aluminum (100 nm) was deposited as a cathode.

Subsequently, an elution preventing film and a sealing film were produced in this order on the cathode under the conditions of the sealing film 1 of Example 1 to produce an organic photoelectric conversion element.

<Evaluation>

When the obtained organic photoelectric conversion element was irradiated with light having a strength of 100 mW/m² of a solar simulator in a state of being left at 60° C. and 90% RH for 10 days, the organic photoelectric conversion element on which the sealing film 1 was applied maintained a photocurrent in an initialization state as compared with the organic photoelectric conversion element on which the sol-gel liquid was not formed (the sealing film 21 and the sealing film 22 of Example 1). From the above results, it was also confirmed that in the organic photoelectric conversion element, high sealing performance was obtained by the sealing film formed by coating according to the present invention.

Example 7

An organic thin film transistor was manufactured by using a sealing film formed by coating according to the present invention.
<Preparation of Organic Thin Film Transistor>
In accordance with FIG. 4A, a source electrode (302) and a drain electrode (303) were formed on a support (306) using a metal foil. Then, an organic semiconductor layer having a thickness of about 30 nm as a charge transfer thin film (organic semiconductor layer 301) composed of 6,13-bistri-isopropylsilylethynylpentacene as an organic semiconductor material described in JP-A No. 2009-101852 between the both electrodes. Then, an insulating layer (305) was formed thereon, and a gate electrode (304) was further formed thereon, thereby manufacturing an organic thin film transistor.

Subsequently, an elution preventing film and a sealing film were formed in this order on the insulating layer (305) and the gate electrode (304) under the conditions of the sealing film 1 of Example 1, thereby fabricating an organic thin film transistor.
<Evaluation>
The obtained organic thin film transistor was left at 60° C. and 90% RH for 10 days, and the operation characteristics of the p-channel enhancement FET (Field-Effect Transistor) were evaluated, and the organic thin film transistor provided with the sealing film 1 exhibited better operation characteristics and carrier transfer characteristics than the organic thin film transistor (the sealing film 21 and the sealing film 22 of Example 1) in which the sol-gel liquid was not formed. From the above results, it was confirmed that the sealing film formed by coating according to the present invention provides high sealing performance also in the organic thin film transistor.

Example 8

The elution preventing film and the sealing film were produced as follows, and the adhesion, flatness, and dark spot resistance were evaluated.
<Preparation of Organometallic Oxides>
A solution of titanium tetraisopropoxide $(Ti(OiPr)_4)$ in 3% by mass in dehydrated tetrafluoropropanol (exemplified compound F-1) was prepared in a glove box under a dry nitrogen atmosphere having a water content of 1 ppm or less, and after 40 mL of air having a humidity of 50% was bubbled, a solution returned to the inside of the glove box was used as a sol-gel solution.

(Evaluation of Adhesion of Elution Preventing Film)
Sample were prepared by spin-coated deposition of the elution preventing film at a thickness of 250 nm on a silicon wafer, then they were irradiated with UV for 1 minute. After each surface treatment described in Table IV, the sol-gel liquid was spin-coated to deposit a film having a thickness of 100 nm. They were dried at 80° C. for 1 minute on a hot plate, and subjected to VUV surface treatment at 2 $J/cm^2$.

Materials used for the elution preventing film are as follows.
UV-PDMS KER-4690: UV-curable polydimethylsiloxane (PDMS) manufactured by Shin-Etsu Chemical Co. Ltd.
Cyclic Siloxane Solvents DMCPS: Decamethylcyclopentasiloxane
PDMS/DMCPS in Table IV indicates the values of the mixed mass ratios of PDMS and DMCPS.
The reforming treatment conditions are as follows.
(VUV: Vacuum Ultraviolet Irradiation Treatment)
Excimer irradiating apparatus MODEL: MECL-M-1-200 manufactured by M. D. COM, Inc.
Wavelength: 172 nm
Lamp filling gas: Xe
Excimer light intensity: 0.3 to 2 $J/cm^2$
Distance between sample and light source: 2 mm
Stage heating temperature: 80° C.
Oxygen concentration in the irradiation apparatus: 0.5 volume %
(UV: Ultraviolet Radiation Treatment)
A high-pressure mercury-lamp was used to irradiate the UV at a wavelength of 365 nm under 2 $J/cm^2$ condition.
(Flash Sintering Process)
Using a xenon flash lamp 2400WS (manufactured by COMET Corporation) equipped with a short wavelength cut filter of 250 nm or less, flash light having 2 $J/cm^2$ total light irradiation energies was irradiated at irradiation time 2 milliseconds in an atmosphere having an oxygen concentration of 0.002% by volume and a water vapor concentration of 0.002% by volume (oxygen-containing substance concentration of 0.004% by volume) to perform sintering treatment.
(Plasma-Ion Injection Process)
Plasma-ion was injected to intermediate layer surfaces obtained by using the Plasma-ion Injection Equipment (RF power supply: RF56000 made by JEOL Ltd.; High-voltage pulse power supply: PV-3-HSHV-0835 made by Kurita Manufacturing Co., Ltd.) under 2 $J/cm^2$ condition.
<Adhesion Property Evaluation (Cross-Cut Method)>
A grid tape test (old JIS K 5400) was performed.
Using a cutter knife on the test surface, 11 cuts are made vertically and horizontally to reach the substrate to obtain 100 grids. Next, the cellophane tape was strongly crimped to the checkerboard portion, and the ends of the tape were peeled off at 45° angles at once, and the checkerboard state between the intermediate layer and PHPS layer was evaluated by comparing with the standardized drawing (FIG. 10).

TABLE IV

| Elution preventing film | Treatment condition | Adhesion property | Remarks |
|---|---|---|---|
| UV-PDMS KER-4690 | None | 5 | Present invention |
| PDMS/DMCPS = 1/12 | None | 5 | Present invention |
| UV-PDMS KER-4690 | VUV (172 nm) 2 $J/cm^2$ | 0 | Present invention |
| PDMS/DMCPS = 1/12 | VUV (172 nm) 0.3 $J/cm^2$ | 2 | Present invention |
| PDMS/DMCPS = 1/12 | VUV (172 nm) 2 $J/cm^2$ | 0 | Present invention |
| PDMS/DMCPS = 1/12 | UV (365 nm) 2 $J/cm^2$ | 5 | Comparative example |

TABLE IV-continued

| Elution preventing film | Treatment condition | Adhesion property | Remarks |
|---|---|---|---|
| PDMS/DMCPS = 1/12 | Flash sintering 2 J/cm$^2$ | 3 | Comparative example |
| PDMS/DMCPS = 1/12 | Plasma-ion injection 2 J/cm$^2$ | 3 | Comparative example |
| Example conditions of JP-A 2015-225785 | None | 4 | Comparative example |

From Table IV, it was found that when the surface treatment of VUV was performed on the elution preventing film, the adhesiveness to the adjacent sealing film was improved.

(Flatness of the Elution Preventing Film)

Each elution preventing film coating solution was spin-coated on a silicon wafer to a thickness of 250 nm, irradiated with UV for 1 minute, and subjected to each surface treatment to obtain a measurement sample. The flatness was evaluated as follows.

The surface state of each sample was observed by AFM (Atomic Force Microscope), and Ra was measured as the surface roughness. The surface roughness is a value measured by AFM (Atomic Force Microscopy) according to JIS B 0601:2001.

Device: DimensionIcon made by Bruker Co. Ltd.

The measurement area is 10 μm×10 μm.

AA: 0 nm<Ra≤1 nm
BB: 1 nm<Ra≤5 nm
CC: 5 nm<Ra

TABLE V

| Elution preventing film | Treatment condition | Flatness | Remarks |
|---|---|---|---|
| UV-PDMS KER-4690 | None | CC | Comparative example |
| UV-PDMS KER-4690 | VUV (172 nm) 2 J/cm$^2$ | AA | Present invention |
| PDMS/DMCPS = 1/12 | None | CC | Comparative example |
| PDMS/DMCPS = 1/12 | VUV (172 nm) 2 J/cm$^2$ | AA | Present invention |
| PDMS/DMCPS = 1/12 | UV (365 nm) 2 J/cm$^2$ | CC | Comparative example |
| PDMS/DMCPS = 1/12 | Flash sintering 2 J/cm$^2$ | BB | Comparative example |
| PDMS/DMCPS = 1/12 | Plasma-ion injection 2 J/cm$^2$ | BB | Comparative example |
| Example conditions of JP-A 2015-225785 | None | BB | Comparative example |

From Table V, it was found that when the surface treatment of VUV was performed on the elution preventing film, the flatness of the surface was most effectively improved.

(Evaluation of Dark Spot Resistance)
(Preparation of Organic EL Element)

A glass substrate on which a 100 nm-thick film of ITO (Indium Tin Oxide) was formed as an anode was subjected to ultrasonic cleaning with isopropyl alcohol, dried with dry nitrogen gas and UV-ozone cleaning, and fixed to a substrate holder of a vacuum evaporation device.

Then, HAT-CN (1,4,5,8,9,12-hexaazatriphenylene hexacarbonitrile) was evaporated to a thickness of 10 nm to provide hole injection-transport layer.

Next, α-NPD (4,4'-bis[N-(1-naphthyl)-N-phenylamino] biphenyl) was vapor-deposited on the hole injection layer to provide a hole transport layer having a thickness of 40 nm.

Then, mCP (1,3-bis(N-carbazolyl)benzene) as a host material and bis[2-(4,6-difluorophenyl)pyridinato-C2,N)(picolinato)iridium(III)(FIrpic) as a light-emitting compound were co-evaporated to be 94% and 6% by volume, respectively, to provide a 30 nm-thick light-emitting layer.

Thereafter, BCP (2,9-dimethyl-4,7-diphenyl-1,10-phenanthroline) was vapor-deposited to provide an electron transport layer with a thickness of 330 nm.

Further, 100 nm-thick silver was further vapor-deposited to provide a cathode.

Next, the elution preventing film coating solution described in Table VI was formed on the cathode by spin coating with the wet film thickness adjusted as described in Table VI, and each surface treatment was performed by irradiating UV for 1 minute.

The following compounds were added as cyclic siloxanes.

Cyclic siloxane-based solvents OMCTS: Octamethylcyclotetrasiloxane

Next, the sol-gel solution described in Table VI was spin-coated on the elution preventing film to a thickness of 100 nm, and then each surface treatment was performed to form a sealing film.

The dark spot resistance of the obtained sample was evaluated by the following procedure.

The light-emitting state after leaving it for several days at 25° C. and 50% atmosphere was observed, and the sealing performance was evaluated. Specifically, a 100-fold optical microscope (MS-804 manufactured by Moritex Corporation, a lens MP-ZE25-200) was photographed by enlarging a portion of the light emitting portion of the organic EL element. Next, the photographed image was cut out in 2 mm squares, and the presence or absence of dark spot generation was observed for each image. The ratio of the area of dark spots generated to the area of light emission was determined from the observation results, and the dark spot resistance was evaluated according to the following criteria.

5: There is no occurrence of dark spots.

4: The area of dark spot generation is 0.1% or more and less than 1.0%.

3: The area of dark spot generation is 1.0% or more and less than 3.0%.

2: The area of dark spot generation is 3.0% or more and less than 6.0%.

1: The area of dark spot generation is 6.0% or more.

TABLE VI

| | Elution preventing film | | Sealing film: Organometallic oxide layer (Sol-gel liquid) | | | | |
|---|---|---|---|---|---|---|---|
| Polymer | Reforming treatment condition | Film thickness [nm] | metal alkoxide | Alcohol | Reforming treatment condition | Dark spot resistance | Remarks |
| UV-PDMS KER-4690 | None | 7000 | Ti(OiPr)$_4$ | F-1 | 2 J/cm$^2$ | 1 | Comparative example |
| UV-PDMS KER-4690 | 2 J/cm$^2$ | 7000 | Ti(OiPr)$_4$ | F-1 | 2 J/cm$^2$ | 3 | Present invention |
| PDMS/DMCPS = 1/4 | 2 J/cm$^2$ | 1000 | Ti(OiPr)$_4$ | F-1 | 2 J/cm$^2$ | 4 | Present invention |
| PDMS/DMCPS = 1/24 | 2 J/cm$^2$ | 50 | Ti(OiPr)$_4$ | F-1 | 2 J/cm$^2$ | 3 | Present invention |
| PDMS/DMCPS = 1/12 | 2 J/cm$^2$ | 250 | Ti(OiPr)$_4$ | F-1 | 2 J/cm$^2$ | 5 | Present invention |
| PDMS/DMCPS = 1/12 | 0.3 J/cm$^2$ | 250 | Ti(OiPr)$_4$ | F-1 | 2 J/cm$^2$ | 4 | Present invention |
| PDMS/OMCTS = 1/12 | 2 J/cm$^2$ | 250 | Ti(OiPr)$_4$ | F-1 | 2 J/cm$^2$ | 4 | Present invention |
| PDMS/DMCPS = 1/12 | Flash sintering 2 J/cm$^2$ | 250 | Ti(OiPr)$_4$ | F-1 | 2 J/cm$^2$ | 2 | Comparative example |
| PDMS/DMCPS = 1/12 | Plasma-ion injection 2 J/cm$^2$ | 250 | Ti(OiPr)$_4$ | F-1 | 2 J/cm$^2$ | 2 | Comparative example |
| Example conditions of JP-A 2015-225785 | None | 250 | Ti(OiPr)$_4$ | F-1 | 2 J/cm$^2$ | 2 | Comparative example |

From Table VI, VUV (2 J/cm 2) is the most effective modification of PDMS. Further, when the organic EL element is diluted to a thickness of 250 nm, the desiccant performance of the desiccant contained in the sealing film is further enhanced, and the dark spot resistance is improved.

INDUSTRIAL APPLICABILITY

The method for manufacturing an electronic device of the present invention is a method for manufacturing an electronic device including an organic thin film functioning as a moisture permeable sealing film for an electronic device, and is suitably used for manufacturing a sealing film for an electronic device such as an organic electroluminescence element, a photoelectric conversion element, an organic thin film solar cell, and an organic thin film transistor.

DESCRIPTION OF SYMBOLS

10: Element
100: Organic EL element
101: Substrate
102: Glass cover or gas barrier film
103: Adhesive
105: Cathode
106: Organic functional layer
107: Glass substrate with transparent electrode
108: Organic thin film (sealing film)
109: Other organic thin film (elution preventing film)
110: Organic thin film outside the present invention
111: Watering material
200: Bulk heterojunction type organic photoelectric conversion device
201: Substrate
202: Transparent electrode (anode)
203: Counter electrode (cathode)
204: Photoelectric conversion unit (bulk heterojunction layer)
205: Charge recombination layer
206: Second photoelectric conversion unit
207: Hole transport layer
208: Electron transport layer
209: First photoelectric conversion unit
301: Semiconductor layer
302: Source electrode
303: Drain electrode
304: Gate electrode
305: Insulating layer
306: Support

What is claimed is:

1. A method of manufacturing an electronic device having at least an organic functional layer, an elution preventing film, and a sealing film in this order, comprising the steps of:
    forming the elution preventing film by irradiating vacuum ultraviolet rays after applying a silicone resin; and
    applying a mixed solution of a metal alkoxide and a fluorinated alcohol on the elution preventing film and then irradiating vacuum ultraviolet rays to form the sealing film,
    wherein in the step of forming the elution preventing film, a siloxane-based solvent is mixed and applied to a silicone resin.

2. The method for manufacturing an electronic device described in claim 1, wherein the siloxane-based solvent is a cyclic siloxane-based solvent.

3. The method for manufacturing an electronic device described in claim 1, wherein a content in mass of the siloxane-based solvent is in the range of 1 to 30 times of a content in mass of the silicone resin.

4. A method of manufacturing an electronic device having at least an organic functional layer, an elution preventing film, and a sealing film in this order, comprising the steps of:
    forming the elution preventing film by irradiating vacuum ultraviolet rays after applying a silicone resin; and
    applying a mixed solution of a metal alkoxide and a fluorinated alcohol on the elution preventing film and then irradiating vacuum ultraviolet rays to form the sealing film,
    wherein a wet film thickness after application of the elution preventing film is 10 μm or less.

5. A method of manufacturing an electronic device having at least an organic functional layer, an elution preventing film, and a sealing film in this order, comprising the steps of:
forming the elution preventing film by irradiating vacuum ultraviolet rays after applying a silicone resin; and
applying a mixed solution of a metal alkoxide and a fluorinated alcohol on the elution preventing film and then irradiating vacuum ultraviolet rays to form the sealing film,
wherein in the step of forming the elution preventing film, a radiation dose of the vacuum ultraviolet ray is in the range of 0.1 to 10 $J/cm^2$.

6. A method of manufacturing an electronic device having at least an organic functional layer, an elution preventing film, and a sealing film in this order, comprising the steps of:
forming the elution preventing film by irradiating vacuum ultraviolet rays after applying a silicone resin; and
applying a mixed solution of a metal alkoxide and a fluorinated alcohol on the elution preventing film and then irradiating vacuum ultraviolet rays to form the sealing film,
wherein in the step of forming the sealing film, a radiation dose of the vacuum ultraviolet ray is in the range of 0.1 to 10 $J/cm^2$.

* * * * *